US010211090B2

(12) United States Patent
Stamper et al.

(10) Patent No.: US 10,211,090 B2
(45) Date of Patent: Feb. 19, 2019

(54) TRANSISTOR WITH AN AIRGAP FOR REDUCED BASE-EMITTER CAPACITANCE AND METHOD OF FORMING THE TRANSISTOR

(71) Applicant: GLOBALFOUNDRIES INC., Grand Cayman (KY)

(72) Inventors: Anthony K. Stamper, Burlington, VT (US); Vibhor Jain, Essex Junction, VT (US); Renata A. Camillo-Castillo, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 261 days.

(21) Appl. No.: 15/291,561

(22) Filed: Oct. 12, 2016

(65) Prior Publication Data
US 2018/0102422 A1    Apr. 12, 2018

(51) Int. Cl.
*H01L 21/768*    (2006.01)
*H01L 29/66*    (2006.01)
(Continued)

(52) U.S. Cl.
CPC ...... *H01L 21/7682* (2013.01); *H01L 23/4821* (2013.01); *H01L 29/41708* (2013.01); *H01L 29/66242* (2013.01); *H01L 29/66287* (2013.01); *H01L 29/732* (2013.01); *H01L 29/7378* (2013.01); *H01L 23/3171* (2013.01)

(58) Field of Classification Search
CPC ............. H01L 21/7682; H01L 23/4821; H01L 29/732; H01L 29/66287; H01L 29/41708; H01L 29/66234; H01L 29/7325; H01L 29/0821; H01L 29/1004; H01L 29/0804;
(Continued)

(56) References Cited

U.S. PATENT DOCUMENTS 5,525,817 A * 6/1996 Hill ........................ B82Y 10/00
                                                          257/197
6,506,659 B2 * 1/2003 Zampardi ......... H01L 29/66242
                                                          257/197
(Continued)

*Primary Examiner* — William F Kraig
*Assistant Examiner* — Khatib A Rahman
(74) *Attorney, Agent, or Firm* — Gibb & Riley, LLC; Anthony J. Canale

(57) ABSTRACT

Disclosed are embodiments of a transistor, which incorporates an airgap for low base-emitter capacitance ($C_{be}$). Each embodiment of the transistor has a monocrystalline base and, within the monocrystalline base, an intrinsic base region and an extrinsic base region positioned laterally adjacent to the intrinsic base region, wherein the intrinsic and extrinsic base regions have co-planar top surfaces. An essentially T-shaped emitter in cross-section has a lower emitter region on the intrinsic base region and an upper emitter region above the lower emitter region. Each embodiment of the transistor further has an airgap, which is positioned laterally adjacent to the lower emitter region so as to be between the extrinsic base region and the upper emitter region. Thus, the entire airgap is above the co-planar top surfaces of the intrinsic base region and the extrinsic base region. Also disclosed herein are methods of forming the transistor embodiments.

18 Claims, 19 Drawing Sheets

(51) Int. Cl.
*H01L 29/417* (2006.01)
*H01L 29/732* (2006.01)
*H01L 29/737* (2006.01)
*H01L 23/482* (2006.01)
*H01L 23/31* (2006.01)

(58) Field of Classification Search
CPC ..... H01L 2924/13051; H01L 29/66242; H01L 21/8224; H01L 29/737
See application file for complete search history.

(56) References Cited

U.S. PATENT DOCUMENTS

| | | |
|---|---|---|
| 6,940,149 B1 | 9/2005 | Divakaruni et al. |
| 7,285,470 B2 | 10/2007 | Bock et al. |
| 8,957,456 B1 | 2/2015 | Camillo-Castillo et al. |
| 2015/0021738 A1 | 1/2015 | Camillo-Castillo et al. |
| 2015/0137185 A1 | 5/2015 | Camillo-Castillo et al. |
| 2016/0087073 A1 | 3/2016 | Camillo-Castillo et al. |

\* cited by examiner

… (1)

TRANSISTOR WITH AN AIRGAP FOR REDUCED BASE-EMITTER CAPACITANCE AND METHOD OF FORMING THE TRANSISTOR

FIELD OF THE INVENTION

The present invention relates to transistors and, more specifically, to bipolar junction transistors (BJTs) and heterojunction bipolar transistors (HBTs) and methods of forming these transistors so as to have reduced base-emitter capacitance ($C_{be}$).

BACKGROUND

Power amplifiers (PAs), low-noise amplifiers (LNAs), and switches, such as those used in radio frequency (RF) applications, typically incorporate bipolar junction transistors (BJTs) and, particularly, high performance heterojunction bipolar transistors (HBTs)). Design modifications to increase the unity short circuit current gain frequency ($f_T$) (i.e., the switching speed) of such transistors can result in corresponding increases in the linearity and gain of the amplifiers. Those skilled in the art will recognize that $f_T$ is a function of the device parasitics, including parasitic resistances and parasitic capacitances. For example, the $f_T$ of a BJT or HBT can be increased by decreasing the base-emitter capacitance ($C_{be}$) and/or decreasing the emitter resistance ($R_e$) and, as a result, the linearity and gain of amplifiers that incorporate such BJTs or HBTs can be increased. $C_{be}$ is often decreased by increasing the separation distance between the base and emitter. Unfortunately, this technique results in a corresponding increase in emitter resistance ($R_e$), which decreases the $f_T$. If the size and, particularly, the width of the BJT or HBT is then increased to lower $R_e$ and increase the $f_T$, a corresponding increase in $C_{be}$ will occur. Thus, it would be advantageous to provide a method of forming a transistor structure (e.g., a BJT or HBT structure), which allows for a decrease in the $C_{be}$ without causing a corresponding increase in $R_e$ or necessitating an increase in device size.

SUMMARY

In view of the foregoing, disclosed herein are embodiments of a transistor (e.g., a bipolar junction transistor (BJT) or a heterojunction bipolar transistor (HBT)), which incorporates an airgap in order to achieve a relatively low base-emitter capacitance ($C_{be}$). Each embodiment of the transistor can have a monocrystalline base and, within the monocrystalline base, an intrinsic base region and an extrinsic base region positioned laterally adjacent to the intrinsic base region, wherein the intrinsic and extrinsic base regions have co-planar top surfaces. An essentially T-shaped emitter in cross-section can have a lower emitter region on the intrinsic base region and an upper emitter region above the lower emitter region. Each embodiment of the transistor can further have an airgap, which is positioned laterally adjacent to the lower emitter region so as to be between the extrinsic base region and a portion of the upper emitter region that extends over the extrinsic base region. Thus, the entire airgap is above the co-planar top surfaces of the intrinsic base region and the extrinsic base region. Also disclosed herein are methods of forming the above-described transistor embodiments.

More particularly, disclosed herein are embodiments of a transistor (e.g., a bipolar junction transistor (BJT) or a heterojunction bipolar transistor (HBT)), which incorporates an airgap in order to achieve a relatively low base-emitter capacitance ($C_{be}$).

Each embodiment of the transistor can have a first semiconductor layer. A monocrystalline area of this first semiconductor layer can form a monocrystalline base of the transistor. This monocrystalline base can have a first width and can include both an intrinsic base region and an extrinsic base region positioned laterally adjacent to the intrinsic base region. The intrinsic base region and the extrinsic base region can have essentially co-planar top surfaces.

Each embodiment of the transistor can also have a second semiconductor layer. The second semiconductor layer can be patterned so as to have a T-shape in cross section and, thus, can form an essentially T-shaped emitter of the transistor. The T-shaped emitter can have a lower emitter region, which has a second width, on the intrinsic base region and an upper emitter region, which has a third width, on the lower emitter region. The third width of upper emitter region can be greater than the second width of the lower emitter region, but less than the first width of the monocrystalline base. Thus, a portion of the upper emitter region can extend laterally beyond the sidewall of the lower emitter region over the extrinsic base region and a portion of the extrinsic base region of the monocrystalline base can extend laterally beyond the sidewall of the upper emitter region.

Each embodiment of the transistor can also have an airgap. This airgap can be positioned laterally adjacent to the lower emitter region such that it is between the extrinsic base region and the portion of the upper emitter region that extends laterally beyond the sidewall of the lower emitter region over the extrinsic base region. Thus, the entire airgap will be above the co-planar top surfaces of the intrinsic base region and the extrinsic base region.

Also disclosed herein are methods of forming a transistor (e.g., a bipolar junction transistor (BJT) or a heterojunction bipolar transistor (HBT)), which incorporates an airgap in order to achieve a relatively low base-emitter capacitance ($C_{be}$).

In one method, a first semiconductor layer having a monocrystalline base with a first width can be formed. A stack of sacrificial layers (e.g., an oxide layer and a nitride layer on the oxide layer) can be formed on the first semiconductor layer. Then, an opening, with a second width, can be formed through the stack to an intrinsic base region of the monocrystalline base.

A second semiconductor layer can be formed on the stack and in the opening. The second semiconductor layer can be patterned to form an essentially T-shaped emitter in cross-section. The T-shaped emitter can have a lower emitter region in the opening and, thereby having the same second width as the opening. The T-shaped emitter can further have an upper emitter region aligned vertically above the lower emitter region and having a third width. The second semiconductor layer can specifically be patterned such that the third width of the upper emitter region is greater than the second width of the lower emitter region and less than the first width of the monocrystalline base.

The stack of sacrificial layers can then be selectively removed from above the first semiconductor layer and, particularly, from between the monocrystalline base and the upper emitter region. Then, an exposed portion of the monocrystalline base can be doped to form, within the monocrystalline base, an extrinsic base region positioned laterally adjacent to the intrinsic base region, wherein the intrinsic base region and the extrinsic base region have essentially co-planar top surfaces.

Subsequently, a dielectric layer can be formed such that it is on the first semiconductor layer and extends upward and over the upper emitter region. This dielectric layer can specifically be formed such that an airgap is created. This airgap can be positioned laterally adjacent to the lower emitter region such that it is between the extrinsic base region and the portion of the upper emitter region that extends laterally beyond the sidewall of the lower emitter region over the extrinsic base region. Thus, the entire airgap will be above the co-planar top surfaces of the intrinsic base region and the extrinsic base region.

In another method, a first semiconductor layer having a monocrystalline base with a first width can be formed. A single sacrificial layer (e.g., an oxide layer) can be formed on the first semiconductor layer. Then, an opening, with a second width, can be formed through the sacrificial layer to an intrinsic base region of the monocrystalline base.

A second semiconductor layer can be formed on the sacrificial layer and in the opening. The second semiconductor layer can be patterned to form an essentially T-shaped emitter in cross section. The T-shaped emitter can have a lower emitter region in the opening and, thereby having the same second width as the opening. The T-shaped emitter can further have an upper emitter region aligned vertically above the lower emitter region and having a third width. The second semiconductor layer can specifically be patterned such that the third width of the upper emitter region is greater than the second width of the lower emitter region and less than the first width of the monocrystalline base.

The sacrificial layer can then be selectively removed from above the first semiconductor layer and, particularly, from between the monocrystalline base and the upper emitter region. Then, an exposed portion of the monocrystalline base can be doped to form, within the monocrystalline base, an extrinsic base region positioned laterally adjacent to the intrinsic base region, wherein the intrinsic base region and the extrinsic base region have essentially co-planar top surfaces.

Subsequently, a dielectric layer can be formed such that it is on the first semiconductor layer and extends upward and over the upper emitter region. This dielectric layer can specifically be formed such that an airgap is created. This airgap can be positioned laterally adjacent to the lower emitter region such that it is between the extrinsic base region and the portion of the upper emitter region that extends laterally beyond the sidewall of the lower emitter region over the extrinsic base region. Thus, the entire airgap will be above the co-planar top surfaces of the intrinsic base region and the extrinsic base region.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, power amplifiers (PAs), low-noise amplifiers (LNAs), and switches, such as those used in radio frequency (RF) applications, typically incorporate bipolar junction transistors (BJTs) and, particularly, high performance heterojunction bipolar transistors (HBTs)). Design modifications to increase the unity short circuit current gain frequency ($f_T$) (i.e., the switching speed) of such transistors can result in corresponding increases in the linearity and gain of the amplifiers. Those skilled in the art will recognize that $f_T$ is a function of the device parasitics, including parasitic resistances and parasitic capacitances. For example, the $f_T$ of a BJT or HBT can be increased by decreasing the base-emitter capacitance ($C_{be}$) and/or decreasing the emitter resistance ($R_e$) and, as a result, the linearity and gain of amplifiers that incorporate such BJTs or HBTs can be increased. $C_{be}$ is often decreased by increasing the separation distance between the base and emitter. Unfortunately, this technique results in a corresponding increase in emitter resistance ($R_e$), which decreases the $f_T$. If the size and, particularly, the width of the BJT or HBT is then increased to lower $R_e$ and increase the $f_T$, a corresponding increase in $C_{be}$ will occur. Thus, it would be advantageous to provide a method of forming a transistor structure (e.g., a BJT or HBT structure), which allows for a decrease in the $C_{be}$ without causing a corresponding increase in $R_e$ or necessitating an increase in device size.

In view of the foregoing, disclosed herein are embodiments of a transistor (e.g., a bipolar junction transistor (BJT) or a heterojunction bipolar transistor (HBT)), which incorporates an airgap in order to achieve a relatively low base-emitter capacitance ($C_{be}$). Each embodiment of the transistor can have a monocrystalline base and, within the monocrystalline base, an intrinsic base region and an extrinsic base region positioned laterally adjacent to the intrinsic base region, wherein the intrinsic and extrinsic base regions have co-planar top surfaces. An essentially T-shaped emitter in cross-section can have a lower emitter region on the intrinsic base region and an upper emitter region above the lower emitter region. Each embodiment of the transistor can further have an airgap, which is positioned laterally adjacent to the lower emitter region so as to be between the extrinsic base region and a portion of the upper emitter region that extends over the extrinsic base region. Thus, the entire airgap is above the co-planar top surfaces of the intrinsic base region and the extrinsic base region. Also disclosed herein are methods of forming the above-described transistor embodiments.

Figure 1A:
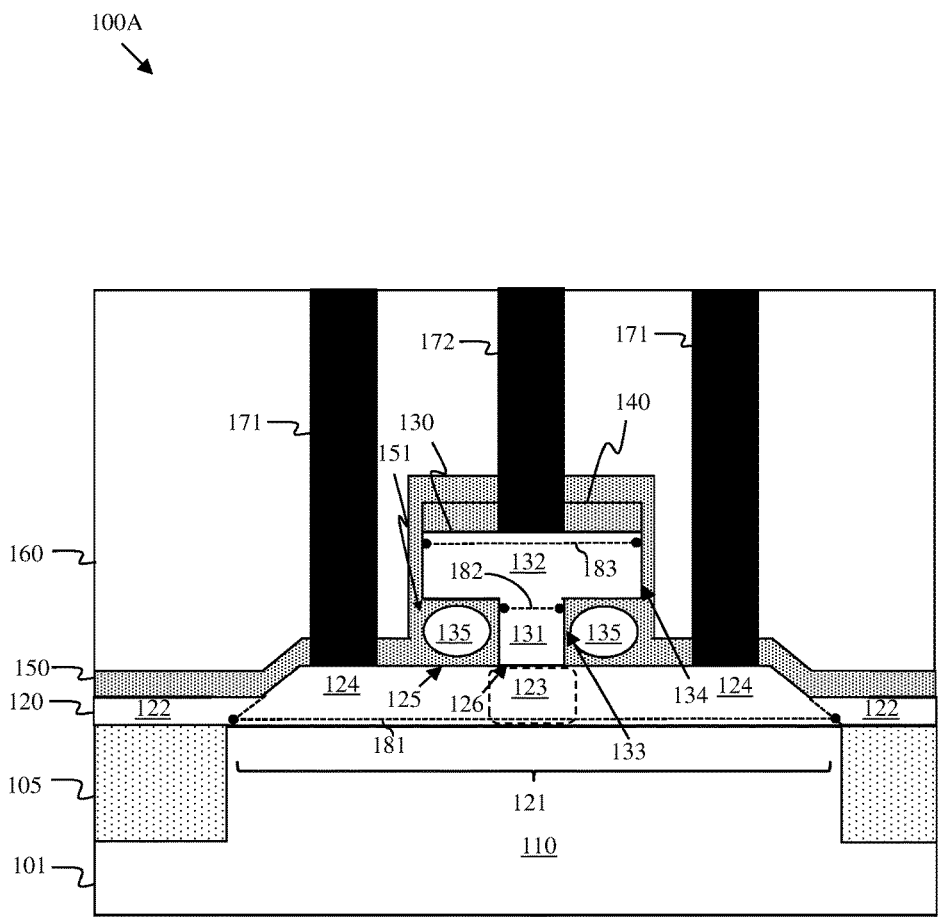
FIGS. 1A-1C are cross-section diagrams illustrating different embodiments of a transistor that incorporates an airgap for relatively low base-emitter capacitance (Cbe)
Figure 1B:
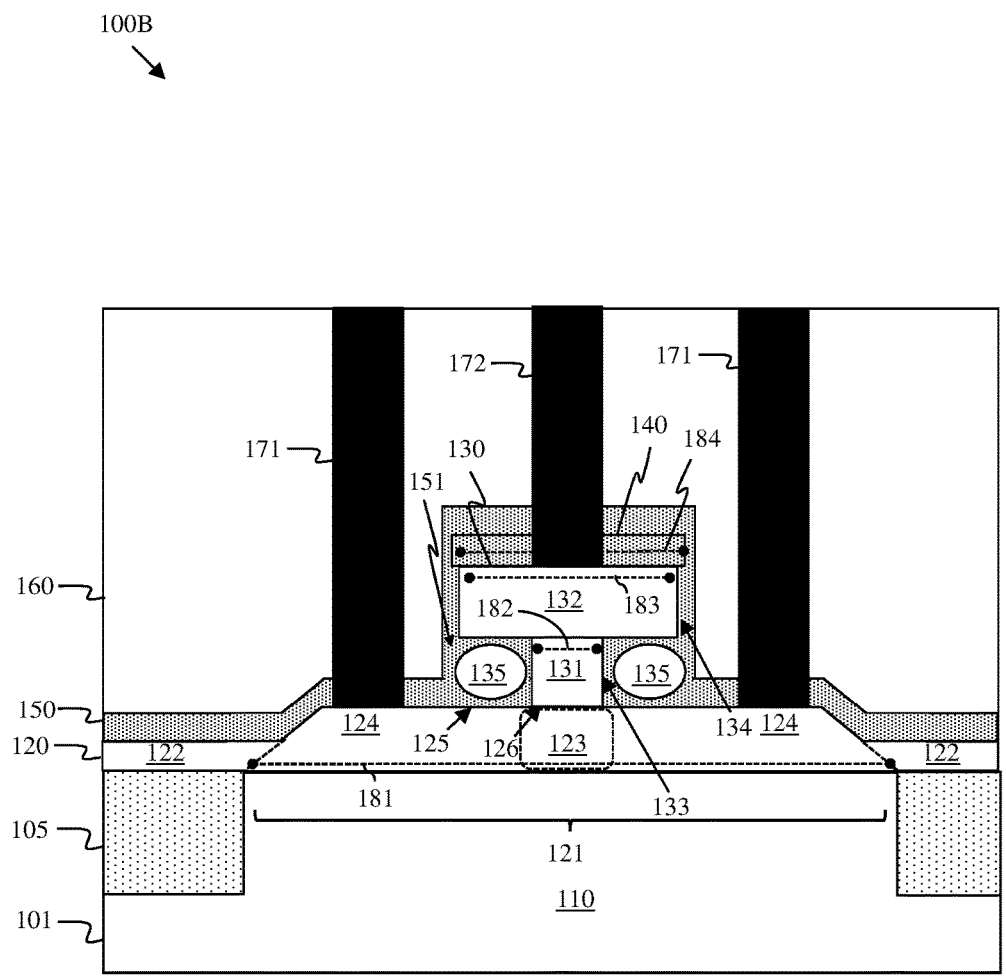
Figure 1C:
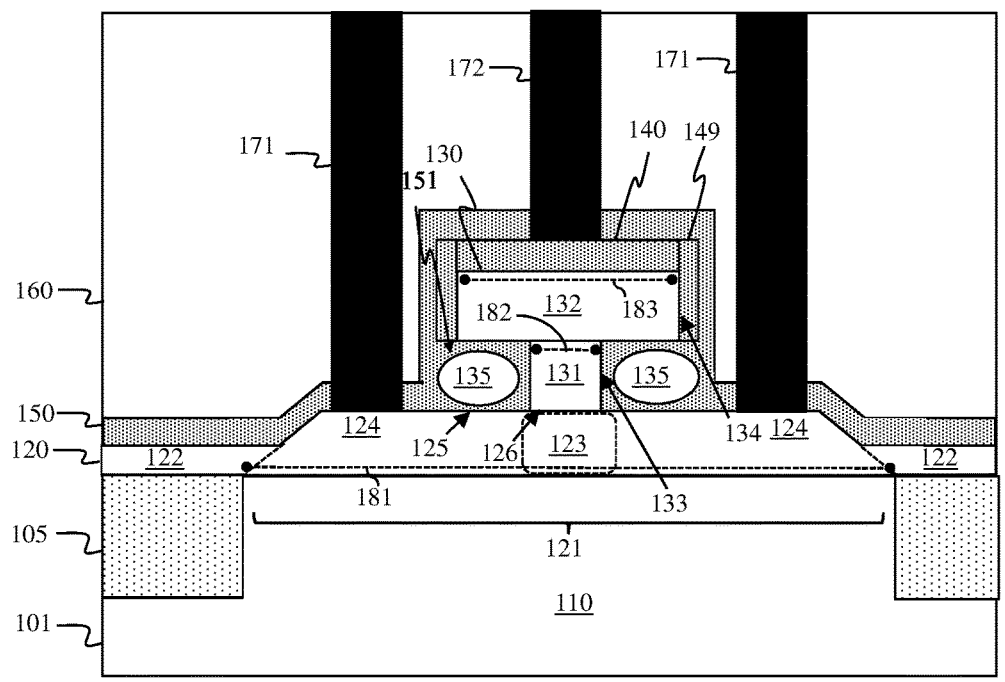

More particularly, referring to FIGS. 1A-1C, disclosed herein are embodiments 100A-100C, respectively, of a transistor (e.g., a bipolar junction transistor (BJT), such as a vertical NPN BJT, or a heterojunction bipolar transistor (HBT), such as a vertical NPN HBT), which incorporates an airgap 135 in order to achieve a relatively low base-emitter capacitance ($C_{be}$). As discussed in greater detail below with regard to the methods, various different techniques can be used to form a transistor with an airgap 135. The different techniques use slightly different processes and different materials during processing. As a result of the different techniques, the different embodiments 100A-100C have a number of features that vary.

In any case, each embodiment 100A-100C of the transistor can include a monocrystalline semiconductor substrate 101 (e.g., a monocrystalline silicon substrate or a monocrystalline substrate of any other suitable semiconductor material). The monocrystalline semiconductor substrate 101 can, for example, be doped with a first type dopant (e.g., a P-type dopant, such as boron or any other suitable P-type dopant as discussed in greater detail below) such that it has a first type conductivity (e.g., P-type conductivity) at a relatively low conductivity level (e.g., such that the substrate 101 is a P– substrate). For illustration purposes, the monocrystalline semiconductor substrate 101 is shown in FIGS. 1A-1C as a bulk semiconductor substrate. However, it should be understood that the monocrystalline semiconductor substrate 101 could, alternatively, be a monocrystalline semiconductor layer of a semiconductor-on-insulator (SOI) wafer.

Each embodiment 100A-100C of the transistor can further include a collector region 110 within the monocrystalline semiconductor substrate 101. This collector region 110 can include at least one dopant implant region. The dopant implant region can be doped with a second type dopant (e.g., an N-type dopant, such as arsenic, phosphorus, or antimony or any other suitable N-type dopant as discussed in greater detail below) so that it has a second type conductivity (e.g., N-type conductivity) at a relatively high conductivity level (e.g., so that the collector region 110 is an N+ collector region). It should be understood that various different configurations for an in-substrate collector region are well known in the art (e.g., a single collector region adjacent to the top surface of the substrate, a buried collector region with a collector pedestal that extends from the buried collector region to the top surface of the substrate, etc.) and any of these configurations could be incorporated into the transistor embodiments disclosed herein.

In any case, each embodiment 100A-100C of the transistor can also include a dielectric isolation region 105 positioned within and at the top surface of the semiconductor substrate 101. Such a dielectric isolation region 105 can laterally surround an upper portion of the collector region 110 so as to define the active area of the transistor. This dielectric isolation region 105 can, for example, be a shallow trench isolation (STI) region. That is, the dielectric isolation region 105 can be formed within a relatively shallow trench. This trench can be patterned and etched into the top surface of the substrate 101 around the upper portion of the collector region 110 and can range, in one exemplary embodiment, in depth from approximately 50 nm to 5 microns in depth. This trench can further be filled with one or more isolation materials (e.g., silicon dioxide ($SiO_2$), silicon nitride (SiN), silicon oxynitride (SiON) or any other suitable isolation material or combination thereof).

Each embodiment 100A-100C of the transistor can further include a first semiconductor layer 120, which is above and immediately adjacent to the top surface of the substrate 101 and which extends laterally over the isolation region 105.

This first semiconductor layer 120 can be an epitaxial semiconductor layer (i.e., a epitaxially deposited semiconductor layer). This first semiconductor layer 120 can have a monocrystalline area for a monocrystalline base 121, which is above and immediately adjacent to the top surface of the monocrystalline semiconductor substrate and, particularly, aligned vertically above the collector region 110. This first semiconductor layer 120 can further have a polycrystalline area 122, which is above and immediately adjacent to the isolation region 105. Those skilled in the art will recognize that, due to the epitaxial deposition process and the different crystalline structures, the monocrystalline base 121 will be relatively thick as compared to the polycrystalline area 122. The first semiconductor layer 120 can, for example, be an epitaxial silicon layer (e.g., in the case of a BJT) or an epitaxial silicon germanium layer (e.g., in the case of an HBT). It should be noted that if the first semiconductor layer 120 is an epitaxial silicon germanium layer, the peak content of germanium can range, for example, from 5 atomic percent to 50 atomic percent. Furthermore, the profile of the germanium across the thickness of the first semiconductor layer 120 may be graded and/or stepped or, alternatively, may be uniform.

The monocrystalline base 121 can have a first width 181 and can include both an intrinsic base region 123, which is at the center of the monocrystalline base 121 aligned above the center of the collector region 110, and an extrinsic base region 124, which is in the outer portion the monocrystalline base 121 positioned laterally adjacent to and, more particularly, laterally surrounding the intrinsic base region 123. The first semiconductor layer 120 can be in situ doped during the epitaxial deposition process (or subsequently implanted) with a first type dopant (e.g., a P-type dopant, such as boron or any other suitable P-type dopant as discussed in greater detail below) such that the intrinsic base region 123 has, for example, the first type conductivity at a relatively lower conductivity level (e.g., such that the intrinsic base region 123 is a P− intrinsic base region). The outer portion of monocrystalline base 121 can be implanted with a first type dopant (e.g., a P-type dopant, such as boron or any other suitable P-type dopant as discussed in greater detail below) such that the extrinsic base region 124 has the first type conductivity at a relatively higher conductivity level (e.g., such that the extrinsic base region 124 is a P+ extrinsic base region). It should be noted that, since the intrinsic base region 123 and the extrinsic base region 124 are both contained within the same monocrystalline area of the first semiconductor layer 120, the intrinsic base region 123 and the extrinsic base region 124 have essentially co-planar top surfaces 126 and 125, respectively. Optionally, the first semiconductor layer 120 can further contain carbon (e.g., can be a silicon carbide or silicon germanium carbide layer), wherein the profile of carbon across the thickness of the first semiconductor layer 120 is sufficient to suppress diffusion of the P-type dopant.

Each embodiment 100A-100C of the transistor can further include a second semiconductor layer 130, which is patterned so as to have a T-shape in cross-section to form an essentially T-shaped emitter of the transistor. The second semiconductor layer 130 (or, more particularly, the T-shaped emitter) can have a lower emitter region 131 and an upper emitter region 132, which is above and wider than the lower emitter region 131. More specifically, the lower emitter region 131 can be immediately adjacent to and aligned above the center of the intrinsic base region 123. The lower emitter region 131 can have a second width 182. The upper emitter region 132 can be immediately adjacent to and centered above the lower emitter region 131. The upper emitter region 132 can have a third width 183, which is greater than the second width 182 of the lower emitter region 131, but less than the first width 181 of the monocrystalline base 121. Thus, a portion of the upper emitter region 132 extends laterally beyond the sidewall 133 of the lower emitter region 131 over the extrinsic base region 124 and a portion of the extrinsic base region 124 of the monocrystalline base 121 extends laterally beyond the sidewall 134 of the upper emitter region 132. The second semiconductor layer 130 can be a polysilicon layer or other suitable semiconductor layer. Additionally, the second semiconductor layer 130 can be doped with a second type dopant (e.g., an N-type dopant, such as arsenic, phosphorus, or antimony or any other suitable N-type dopant as discussed in greater detail below) such that the T-shaped emitter including the lower emitter region 131 and the upper emitter region 132 have the second type conductivity (e.g., N-type conductivity) at a relatively high conductivity level (e.g., such that the emitter is a N+ emitter).

For purposes of illustration, the emitter is shown with a planar top surface. However, it should be understood that, depending upon the width of the opening, the thickness of the second semiconductor layer, and any planarizing performed, etc., the second semiconductor layer may appear conformal in embodiments not shown. In this case, the upper emitter region 132 will include a dip or divot aligned above the opening and the lower emitter region 131 such that the top surface of the emitter is non-planar.

Each embodiment 100A-100C of the transistor can further have a dielectric cap 140 (e.g., a silicon nitride cap) and a non-conformal dielectric layer 150. The dielectric cap 140 can be immediately adjacent to and can cover the top surface of the upper emitter region 132. The dielectric layer 150 can be on the first semiconductor layer 120 and can further extend upward and over the emitter 130.

Additionally, each embodiment 100A-100C of the transistor can further include an airgap 135, which is positioned laterally adjacent to the lower emitter region 131 so as to be between the extrinsic base region 124 and a portion of the upper emitter region 132 that extends over the extrinsic base region 124. Thus, the entire airgap 135 is above the co-planar top surfaces 126 and 125 of the intrinsic base region 123 and the extrinsic base region 124, respectively. For example, as discussed in greater detail with regard to the method, during processing a cavity can be formed between the planar top surface 125 of the extrinsic base region 124 and the bottom surface of the portion of the upper emitter region 132. The dielectric layer 150 can close off the cavity, creating the airgap. As illustrated, however, currently available techniques for depositing the dielectric layer 150 will generally result in the cavity being at least partially filled with a portion 151 of the dielectric material of the dielectric layer and with the airgap 135 being contained within that portion 151 of the dielectric material.

As discussed in greater detail below with regard to the methods, various different techniques can be used to form a transistor with an airgap 135 as described. The different techniques use slightly different processes and different materials to protect various surfaces of the emitter regions 131-132 and monocrystalline base 121 during processing. As a result of the different techniques, the different structural embodiments 100A-100C have a number of features that vary.

For example, as shown in FIG. 1A, in one embodiment 100A of the transistor, the dielectric cap 140 (e.g., the silicon nitride cap) can have essentially the same width 183 as the upper emitter region 132 such that sidewalls of the dielectric cap 140 and upper emitter region 132 are vertically aligned. In this embodiment 100A, a vertical portion of the dielectric layer 150 is also positioned laterally immediately adjacent to the sidewall 134 of the upper emitter region 132 and to the sidewall of the dielectric cap 140 and a horizontal portion of the dielectric layer 150 is positioned above and immediately adjacent to the top surface of the dielectric cap 140.

As shown in FIG. 1B, in another embodiment 100B of the transistor, the dielectric cap 140 (e.g., the silicon nitride cap) can have a fourth width 184 that is greater than the third width 183 of the upper emitter region 132 such that the sidewalls of the dielectric cap 140 and the upper emitter region 132 are not vertically aligned. As with the embodiment 100A of FIG. 1A, in this embodiment 100B, a vertical portion of the dielectric layer 150 is positioned laterally immediately adjacent to the sidewall 134 of the upper emitter region 132 and to the sidewall of the dielectric cap 140 and a horizontal portion of the dielectric layer 150 is positioned above and immediately adjacent to the top surface of the dielectric cap 140.

As shown in FIG. 1C, in yet another embodiment 100C of the transistor, the dielectric cap 140 (e.g., the silicon nitride cap) can have essentially the same width 183 as the upper emitter region 132 such that sidewalls of the dielectric cap 140 and upper emitter region 132 are vertically aligned. This embodiment 100C of the transistor can also have a dielectric sidewall spacer 149 positioned laterally immediately adjacent to the sidewall 134 of the upper emitter region 132 and the sidewall of the dielectric cap 140. The dielectric sidewall spacer 149 can be, for example, a silicon nitride sidewall spacer. In this case, a vertical portion of the dielectric layer 150 is positioned laterally immediately adjacent to the dielectric sidewall spacer 149 and a horizontal portion of the dielectric layer 150 is positioned above and immediately adjacent to the top surfaces of the dielectric sidewall spacer 149 and the dielectric cap 140. Thus, the dielectric layer 150 is physically separated from the upper emitter region 132 by the dielectric cap 140 and dielectric sidewall spacer 149. Additionally, it should be noted that, in this embodiment 100C, the airgap 135 may extend laterally beyond the sidewall 134 of the upper emitter region 132 and below the dielectric sidewall spacer 149.

In any case, each embodiment 100A-100C of the transistor can also have one or more layers of interlayer dielectric material (ILD) 160 on the dielectric layer 150 above the transistor and contacts that extend vertically through the ILD 160 and dielectric layer 150 to the planar top surface 125 of the extrinsic base region 124 (or, if applicable, to the silicide thereon) (see contacts 171), to the upper emitter region 132 (see contact 172), to the collector region 110 (not shown) and to the substrate 101 (not shown). The ILD material 160 can be, for example, silicon oxide or any other suitable ILD material (e.g., borophosphosilicate glass (BPSG), tetraethyl orthosilicate (TEOS), fluorinated tetraethyl orthosilicate (FTEOS), etc.). As mentioned above, the top surface of the emitter is shown as being planar; however, alternatively, there may be a dip or divot in the upper emitter region 132 aligned above the lower emitter region. In this case, the contact 172 may extend at least partially through the upper emitter region (not shown), thereby reducing emitter resistance.

It should be noted that the addition of the dielectric cap 140 (e.g., the silicon nitride cap) on the top surface of upper emitter region 132 functions as an etch stop layer during etching of the openings for the contacts and, specifically, ensures that the contact opening for the contact 172 to the upper emitter region 132 is not etched through the emitter down to the monocrystalline base 121.

Figure 2:
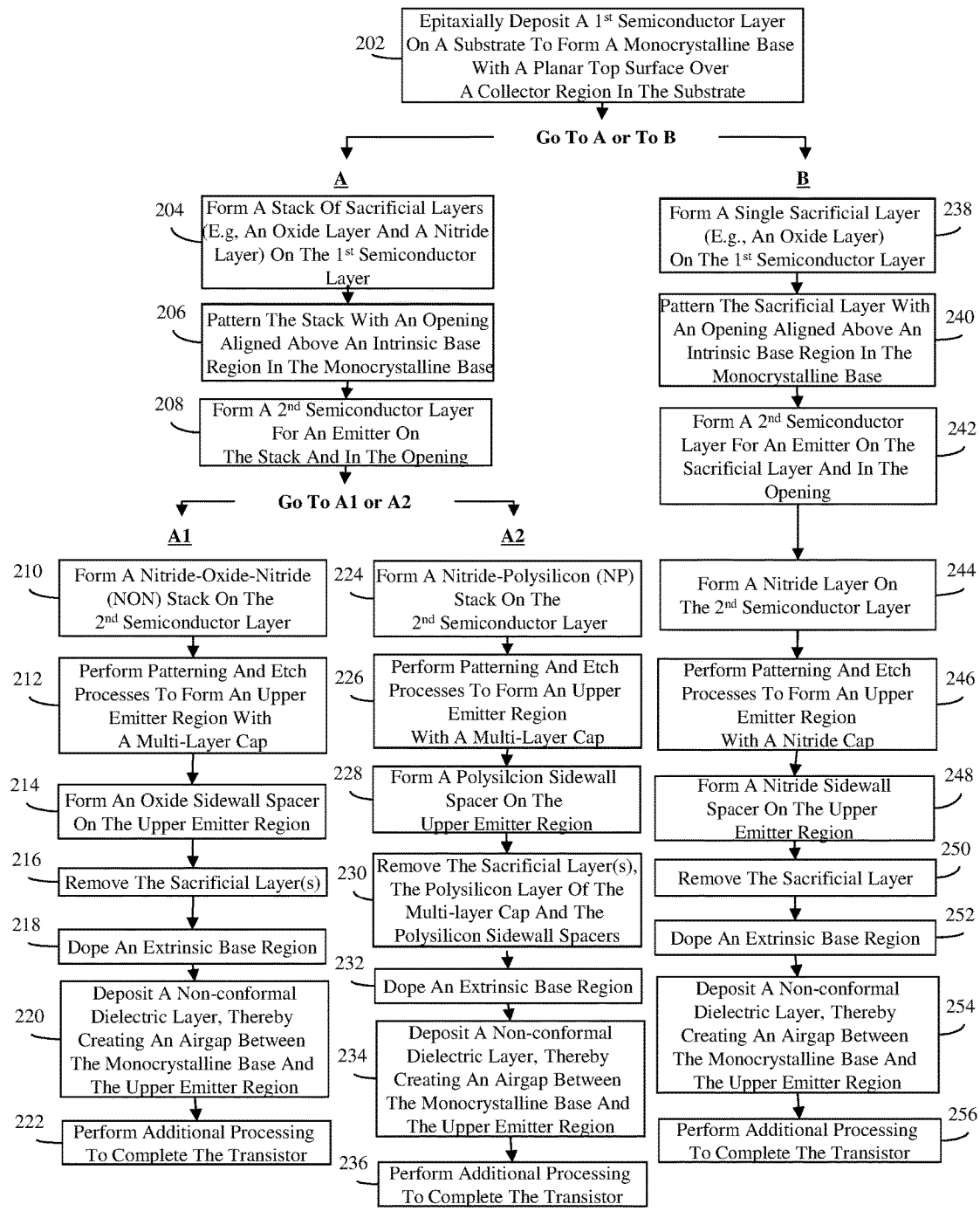
FIG. 2 is a flow diagram illustrating different embodiments of a method of forming a transistor that incorporates an airgap for relatively low base-emitter capacitance (Cbe)

Referring to the flow diagram of FIG. 2, also disclosed herein are methods of forming the above-described embodiments 100A-100C of a transistor (e.g., of a bipolar junction transistor (BJT) such as a vertical NPN BJT, or a heterojunction bipolar transistor (HBT), such as a vertical NPN HBT), which incorporates an airgap 135 in order to achieve a relatively low base-emitter capacitance ($C_{be}$).

Figure 3:
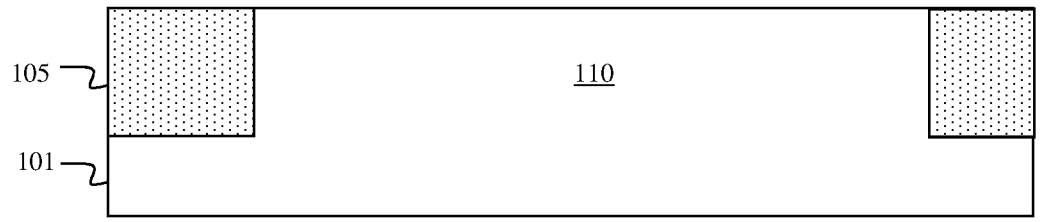
FIG. 3 is a cross-section diagram illustrating a partially completed transistor formed according to the process flows A or B of FIG. 2.

Each of the methods can begin with a monocrystalline semiconductor substrate 101 (e.g., a monocrystalline silicon substrate or a monocrystalline substrate of any other suitable semiconductor material) (see FIG. 3). This monocrystalline semiconductor substrate 101 can, for example, be doped with a first type dopant (e.g., a P-type dopant, such as boron or any other suitable P-type dopant as discussed in greater detail below) such that it has a first type conductivity (e.g., P-type conductivity) at a relatively low conductivity level (e.g., such that the substrate 101 is a P− substrate). For illustration purposes, the monocrystalline semiconductor substrate 101 is shown in FIG. 3 as a bulk semiconductor substrate. However, it should be understood that the monocrystalline semiconductor substrate 101 could, alternatively, be a monocrystalline semiconductor layer of a semiconductor-on-insulator (SOI) wafer.

Each of the methods can further include the formation, within the monocrystalline semiconductor substrate 101, of a collector region 110 and of a dielectric isolation region 105 that laterally surrounds at least an upper portion of the collector region 110. The collector region 110 can, for example, be formed by performing at least one dopant implant processes such that the resulting collector region 110 is doped with a second type dopant (e.g., an N-type dopant, such as arsenic, phosphorus, or antimony or any other suitable N-type dopant as discussed in greater detail below) and has a second type conductivity (e.g., N-type conductivity) at a relatively high conductivity level (e.g., so that the collector region 110 is an N+ collector region). Various different configurations for an in-substrate collector region (e.g., a single collector region adjacent to the top surface of the substrate, a buried collector region with a collector pedestal that extends from the buried collector region to the top surface of the substrate, etc.) are well known in the art, as are the techniques for forming these different configurations. Thus, it should be understood that the methods disclosed herein could incorporate any suitable processes used to form a collector region within a monocrystalline semiconductor substrate.

The isolation region 105 can be formed as a shallow trench isolation (STI) region or any other suitable type of dielectric isolation region. The isolation region can be formed either before or after formation of the collector region 110. For example, conventional lithographic patterning and etch processes may be used to form a relatively shallow trench at the top surface of the substrate 101 (e.g., around the upper portion of the collector region 110, if previously formed, or around a designated area for the upper portion of the collector region 110). This trench can be etched to a depth that ranges, in one exemplary embodiment, from approximately 50 nm to approximately 5 microns. This trench can subsequently be filled with one or more isolation materials (e.g., silicon dioxide ($SiO_2$), silicon nitride (SiN), silicon oxynitride (SiON) or any other suitable isolation material or combination thereof). Next, a chemical-mechanical polishing (CMP) process can be performed in order to remove the isolation material(s) from above the top surface of the substrate 101.

Figure 4:
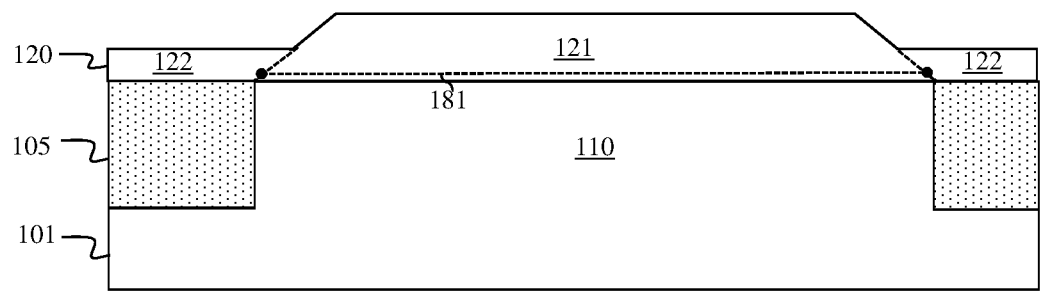
FIG. 4 is a cross-section diagram illustrating a partially completed transistor formed according to the process flows A or B FIG. 2.

A first semiconductor layer 120 can then be deposited onto the top surface of the monocrystalline semiconductor substrate 101 and over the isolation region 105 (202, see FIG. 4). This deposition process can be, for example, an ultra-high vacuum (UHV), chemical vapor deposition (CVD), selective, low-temperature epitaxial (LTE) deposition process. As a result of such an epitaxial deposition process, the first semiconductor layer 120 will have both monocrystalline and polycrystalline areas 121-122. The monocrystalline area for a monocrystalline base 121 will be above and immediately adjacent to the top surface of the monocrystalline semiconductor substrate 101 and, particularly, adjacent to the collector region 110 within the substrate. The monocrystalline base 121 will have a first width 181, which is approximately equal to the width of the upper portion of the collector region 110, as defined by the isolation region 105. The polycrystalline area 122 can be above and immediately adjacent to the top surface of the isolation region 105. Those skilled in the art will recognizes that, as a result of such an epitaxial deposition process, the monocrystalline base 121 will be relatively thick as compared to the polycrystalline area 122 and faceting at the interface between the monocrystalline base 121 and the polycrystalline area 122 may occur. The first semiconductor layer 120 can be in situ doped during the epitaxial deposition process 202 (or subsequently implanted) with a first type dopant (e.g., a P-type dopant, such as boron or any other suitable P-type dopant as discussed in greater detail below) such that, initially, it has the first type conductivity at a relatively low conductivity level. The first semiconductor layer 120 can be an epitaxial silicon layer (e.g., in the case of a BJT), an epitaxial silicon germanium layer (e.g., in the case of an HBT) or any other suitable semiconductor layer (e.g., a silicon carbide layer or a silicon germanium carbide layer, etc.). If the first semiconductor layer 120 is an epitaxial silicon germanium layer, the peak content of germanium can range, for example, from 5 atomic percent to 50 atomic percent. Furthermore, the profile of the germanium across the thickness of the first semiconductor layer 120 may be graded and/or stepped or, alternatively, may be uniform. Additionally, if the first semiconductor layer 129 is a silicon carbide or silicon germanium carbide layer, profile of the carbon content across the thickness of the first semiconductor layer 120 may be sufficient to suppress the diffusion of the P-type dopant.

It should be noted that the methods shown in FIG. 2 vary after the first semiconductor layer 120 has been epitaxially deposited at process 202. For example, in order to form the embodiments 100A or 100B of the transistor shown in FIGS. 1A and 1B, the process flow A (including either steps A1 or steps A2) may be performed. Alternatively, in order to form the embodiment 100C of the transistor shown in FIG. 1C, the process flow B may be performed. As discussed in greater detail below, steps 236-240 are the same for each of the methods.

Figure 5:
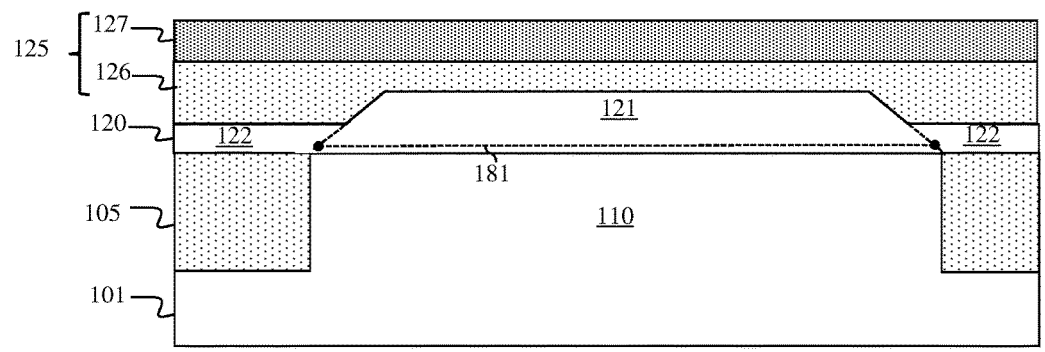
FIG. 5 is a cross-section diagram illustrating a partially completed transistor formed according to process flows A1 or A2 of FIG. 2.
Figure 6:
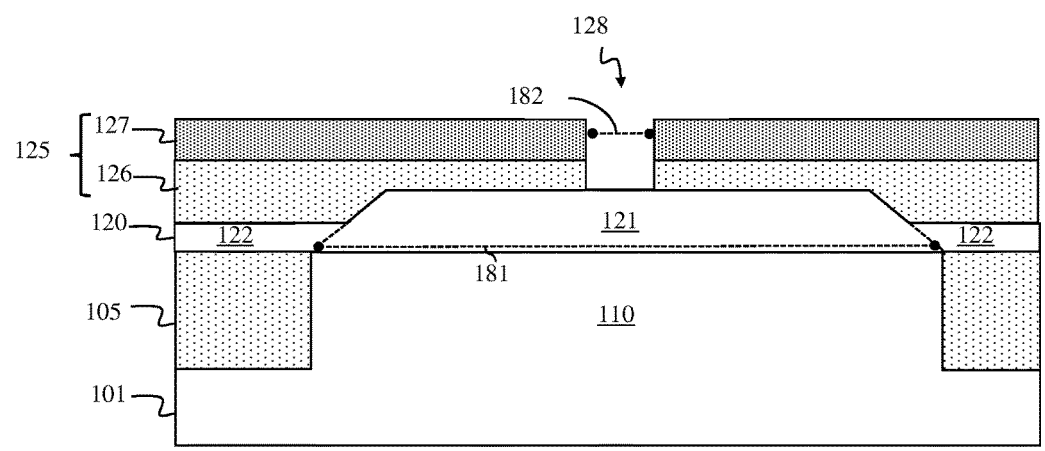
FIG. 6 is a cross-section diagram illustrating a partially completed transistor formed according to process flows A1 or A2 of FIG. 2.

More specifically, referring to the process flow A, after the first semiconductor layer 120 is epitaxially deposited at process 202, a stack 125 of sacrificial layers can be formed on the first semiconductor layer 120 (204, see FIG. 5). These sacrificial layers can include, for example, a first silicon dioxide layer 126 on the first semiconductor layer 120 and a first silicon nitride layer 127 on the first semiconductor layer 120. An opening 128 with a second width 182 can then be formed through the stack 125 to a center portion only of the monocrystalline base 121 and, particularly, to a designated intrinsic base region 123 within the monocrystalline base 121 (206, see FIG. 6). This opening 128 can be formed, for example, using conventional lithographic patterning and etch processes. Such processes are well known in the art and, thus, the details thereof are omitted from this specification in order to allow the reader to focus on the salient aspects of the disclosed method.

Figure 7:
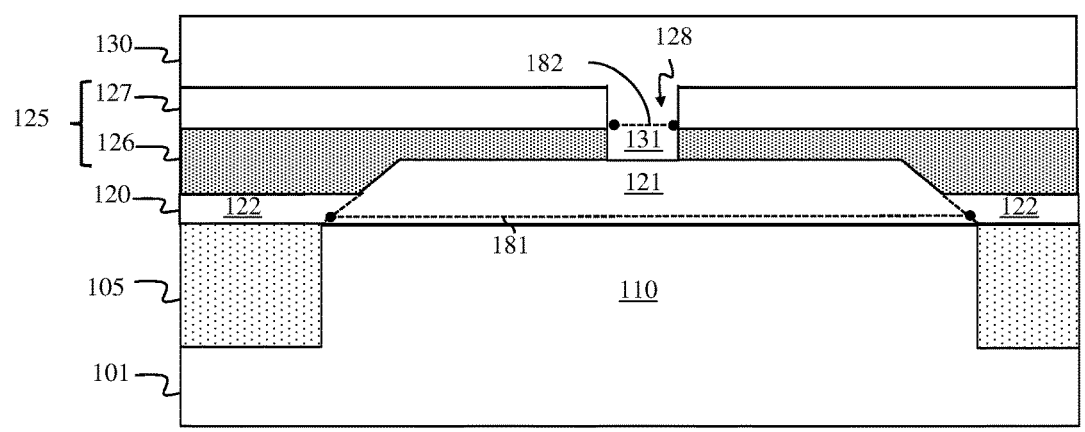
FIG. 7 is a cross-section diagram illustrating a partially completed transistor formed according to process flows A1 or A2 of FIG. 2.

Next, a pre-clean process can be performed and a second semiconductor layer 130 for an emitter can be formed (e.g., deposited by chemical vapor deposition (CVD)) onto the stack 125 and in the opening 128 (208, see FIG. 7). This second semiconductor layer 130 can be, for example, a polysilicon layer. For purposes of illustration, the second semiconductor layer 130 is shown with a planar top surface. However, it should be understood that, depending upon the width of the opening, the thickness of the second semiconductor layer, and any planarizing performed, etc., the second semiconductor layer may appear conformal in embodiments not shown. In this case, there will be a dip or divot aligned above the opening such that the top surface is non-planar.

After the second semiconductor layer 130 is formed at process 208, the process flow A1 or, alternatively, the process flow A2 set forth in the flow diagram of FIG. 2 can be followed.

Figure 8:
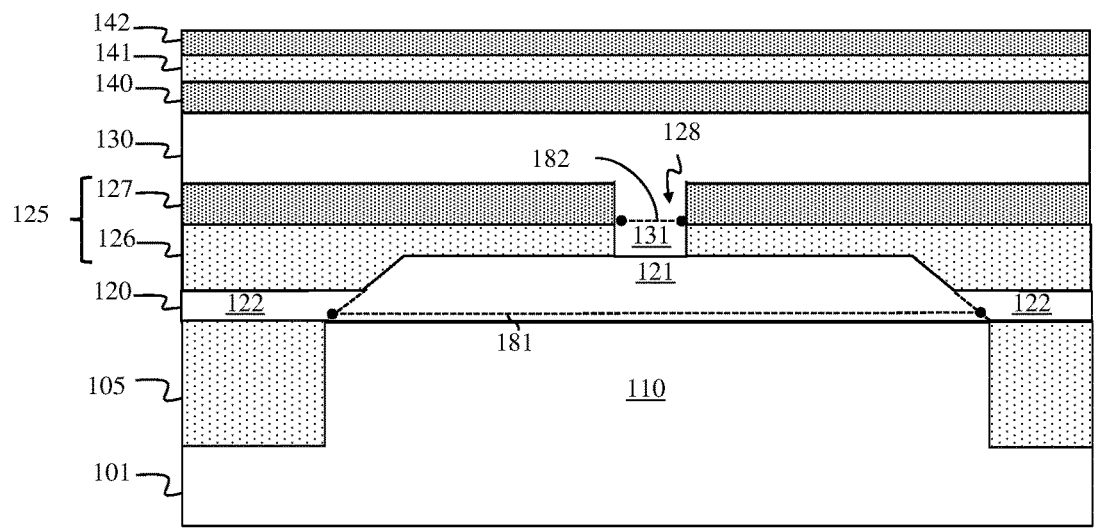
FIG. 8 is a cross-section diagram illustrating a partially completed transistor formed according to process flow A1 of FIG. 2.

Referring to the process flow A1, after the second semiconductor layer 130 is formed at process 208, a nitride-oxide-nitride (NON) stack can be formed above the second semiconductor layer 130 (210, see FIG. 8). That is, a stack of layers can be formed above the second semiconductor layer 130 and this stack can include a second silicon nitride layer 140 on the second semiconductor layer 130, a second silicon dioxide layer 141 on the second silicon nitride layer 140 and a third silicon nitride layer 142 on the second silicon dioxide layer 141.

Figure 9:
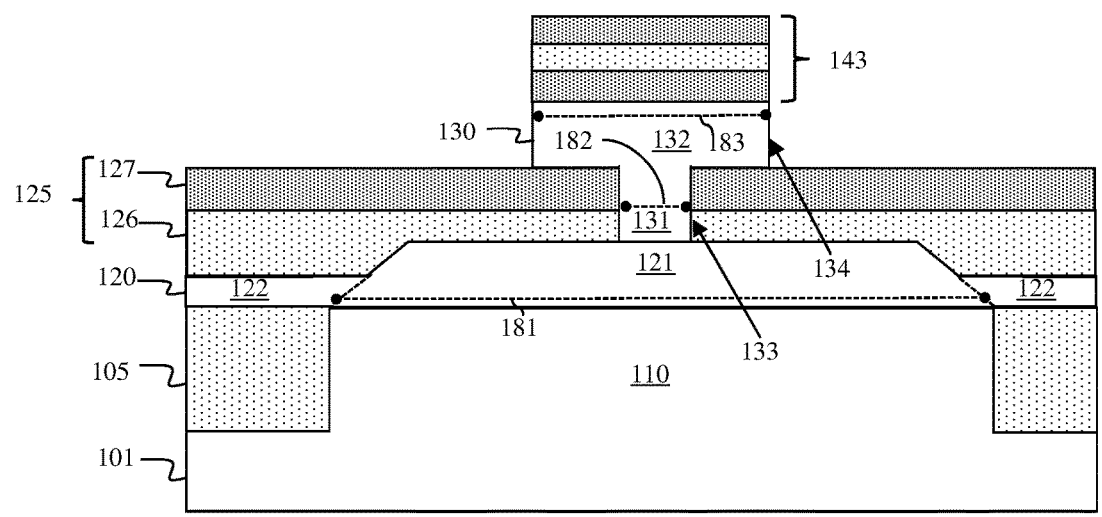
FIG. 9 is a cross-section diagram illustrating a partially completed transistor formed according to process flow A1 of FIG. 2.

Next, conventional lithographic patterning and etch processes can be performed in order to form, from the second semiconductor layer 130 and the NON stack, an essentially T-shaped emitter, in cross-section, with a multi-layer cap 143 (212, see FIG. 9). The T-shaped emitter can have a lower emitter region 131, which is in the opening 128 so that it too has the same width as the opening (i.e., the second width 182), and an upper emitter region 132 above the lower emitter region 131. The second semiconductor layer 130 can specifically be patterned such that the upper emitter region 132 has a third width 183, which is greater than the second width 182 of the lower emitter region 131 and less than the first width 181 of the monocrystalline base 121. Thus, a portion of the upper emitter region 132 extends laterally beyond the sidewall 133 of the lower emitter region 131 onto the top surface of the sacrificial layers and an outer portion of the monocrystalline base 121 extends laterally beyond the sidewall 134 of the upper emitter region 132.

It should be noted that the second semiconductor layer 130 could be either in-situ doped at process 208 with a second type dopant (e.g., an N-type dopant, such as arsenic, phosphorus, or antimony or any other suitable N-type dopant as discussed in greater detail below) or subsequently implanted with the second type dopant. In either case, doping of the second semiconductor layer 130 should be performed such that the T-shaped emitter including the lower emitter region 131 and the upper emitter region 132 have the second type conductivity (e.g., N-type conductivity) at a relatively high conductivity level (e.g., such that the emitter is an N+ emitter).

Figure 10:
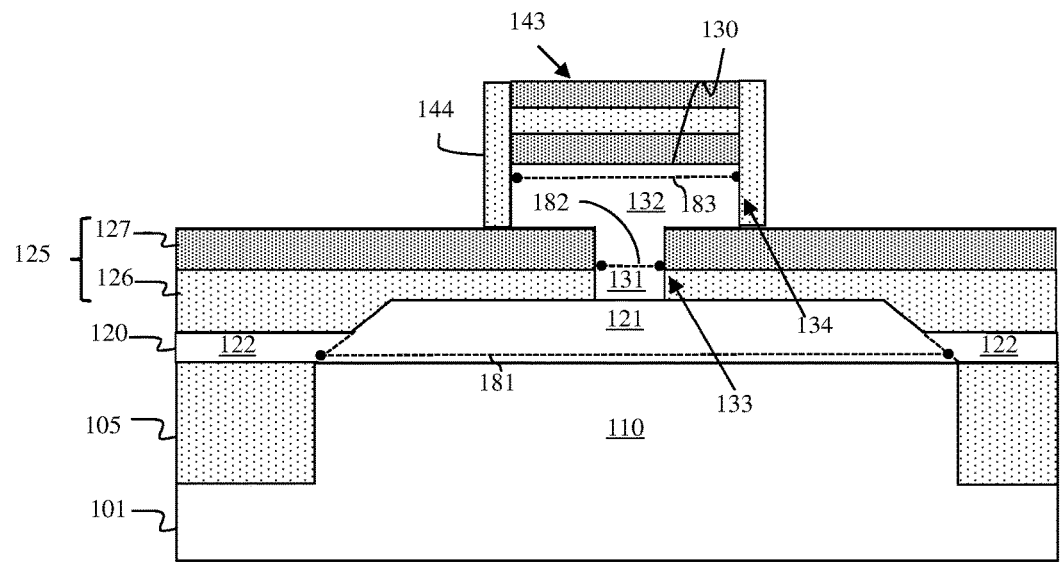
FIG. 10 is a cross-section diagram illustrating a partially completed transistor formed according to process flow A1 of FIG. 2.

Once the T-shaped emitter with a multi-layer cap 143 is formed at process 212, a silicon dioxide sidewall spacer 144 can be formed on the sidewall 134 of the upper emitter region 132 (214, see FIG. 10). For example, a silicon dioxide layer can be conformally deposited over the sacrificial layers, the multi-layer cap 143 and the upper emitter region 132. Then, an anisotropic etch process can be performed, removing the deposited silicon dioxide material from the top surfaces of the multi-layer cap and the stack of sacrificial layers and leaving it on the sidewall 134 of the upper emitter region 132. It should be noted that in this embodiment the second silicon dioxide layer 141, the third silicon nitride layer 142 and the oxide sidewall spacer 144 are all sacrificial features that protect the second silicon nitride layer 140 and the second semiconductor layer 130 during process 216, described below, and are generally not found in the resulting transistor structure.

Figure 11:
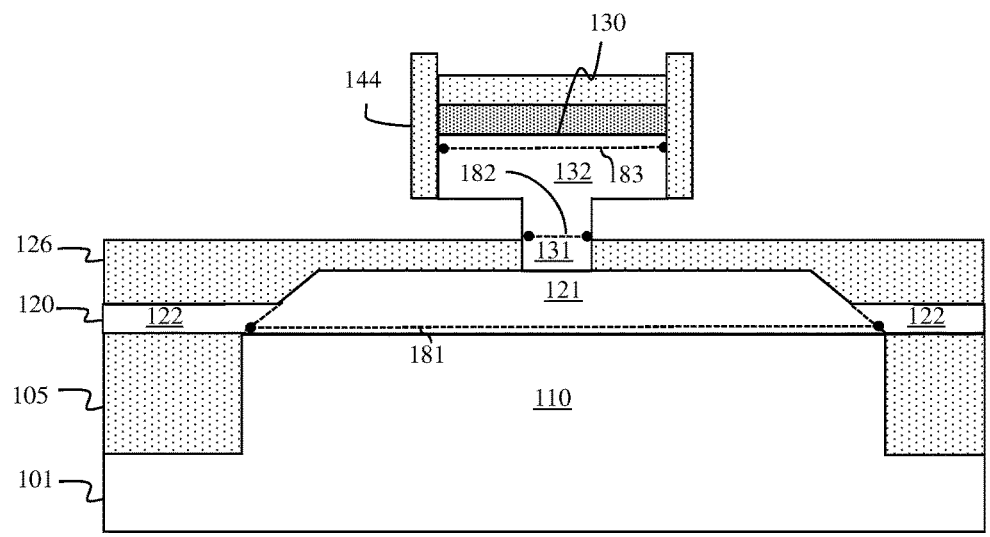
FIG. 11 is a cross-section diagram illustrating a partially completed transistor formed according to process flow A1 of FIG. 2.
Figure 12:
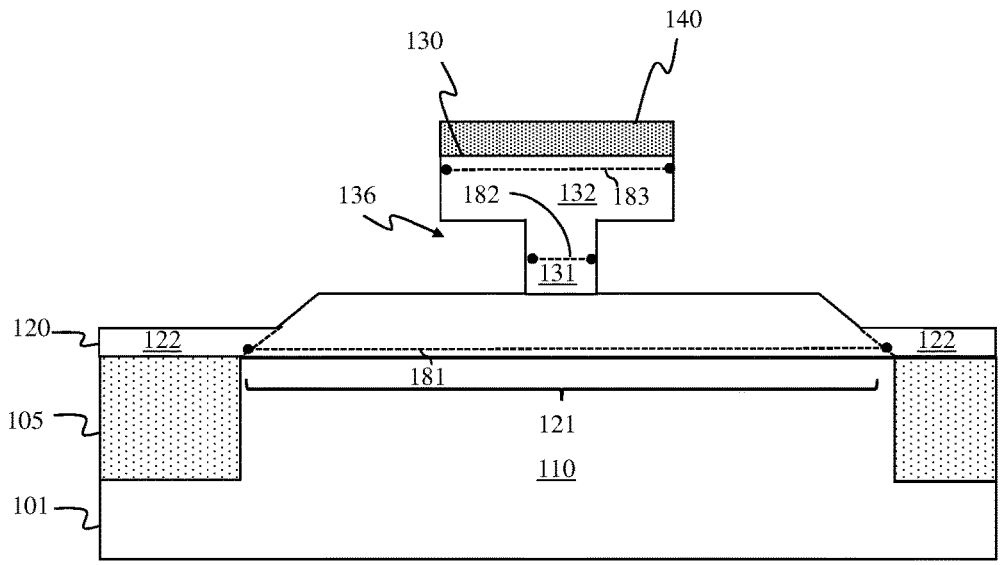
FIG. 12 is a cross-section diagram illustrating a partially completed transistor formed according to process flow A1 of FIG. 2.

The sacrificial layers 126 and 127 can then be selectively removed (216). Specifically, a first selective etch process can be performed in order to selectively remove the first silicon nitride layer 127 in the stack of sacrificial layers, stopping on the oxide material (see FIG. 11). This first selective etch process will also simultaneously remove a remaining portion of the third silicon nitride layer 142 exposed at the top of the multi-layer cap 143. A second selective etch process can then be performed in order to selectively remove the first silicon dioxide layer 126 in the stack of sacrificial layers (see FIG. 12). This second selective etch process will also simultaneously remove the silicon dioxide sidewall spacer 144 and a remaining portion of the second silicon dioxide layer 141 exposed at the top of the multi-layer cap 143 following the first selective etch process. Thus, following the second selective etch process, only a silicon nitride cap 140 will remain on the upper emitter region 132. Various different techniques are well known in the art for selectively removing (i.e., etching away) silicon nitride over silicon dioxide or silicon dioxide over silicon and, thus, the details of these techniques are omitted from this specification in order to allow the reader to focus on the salient aspects of the disclosed methods.

Figure 13:
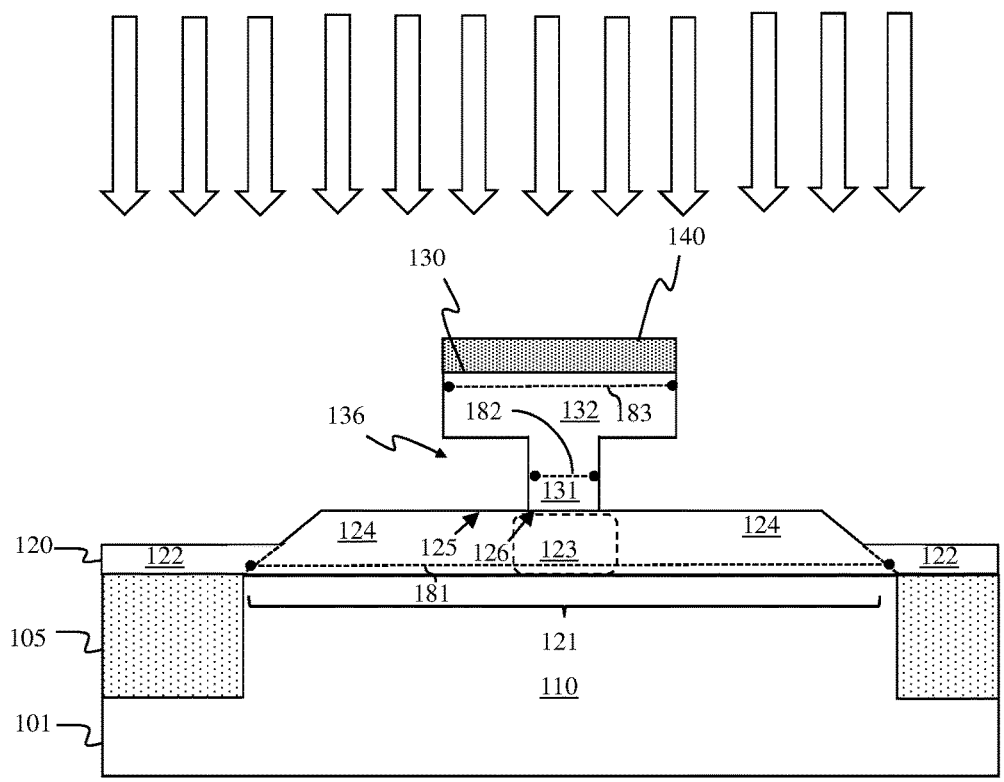
FIG. 13 is a cross-section diagram illustrating a partially completed transistor formed according to process flow A1 of FIG. 2.

Removal of the sacrificial layers at process 216 exposes the outer portion of the monocrystalline base 121 and creates a cavity 136 positioned laterally adjacent to the lower emitter region 131 and between the monocrystalline base 121 and the portion of the upper emitter region 132 that extends laterally over the monocrystalline base 121. The exposed outer portion of the monocrystalline base 121 can be implanted with a first type dopant (e.g., a P-type dopant, such as boron or any other suitable P-type dopant as discussed in greater detail below), thereby creating an extrinsic base region 124 with the first type conductivity at a relatively high conductivity level (e.g., thereby creating a P+ extrinsic base region) (218, see FIG. 13). The extrinsic base region 124 will be positioned laterally adjacent and, more particularly, will be positioned laterally surrounding the intrinsic base region 123, which is aligned below the emitter and, thereby protected from doping during this process. As illustrated, since the intrinsic base region 123 and the extrinsic base region 124 are both contained within the same monocrystalline area of the first semiconductor layer 120, the intrinsic base region 123 and the extrinsic base region 124 have essentially co-planar top surfaces 126 and 125, respectively. Optionally, following formation of the extrinsic base region 124 at process 218, a silicide layer (not shown) can be formed on the exposed semiconductor surfaces.

Figure 14:
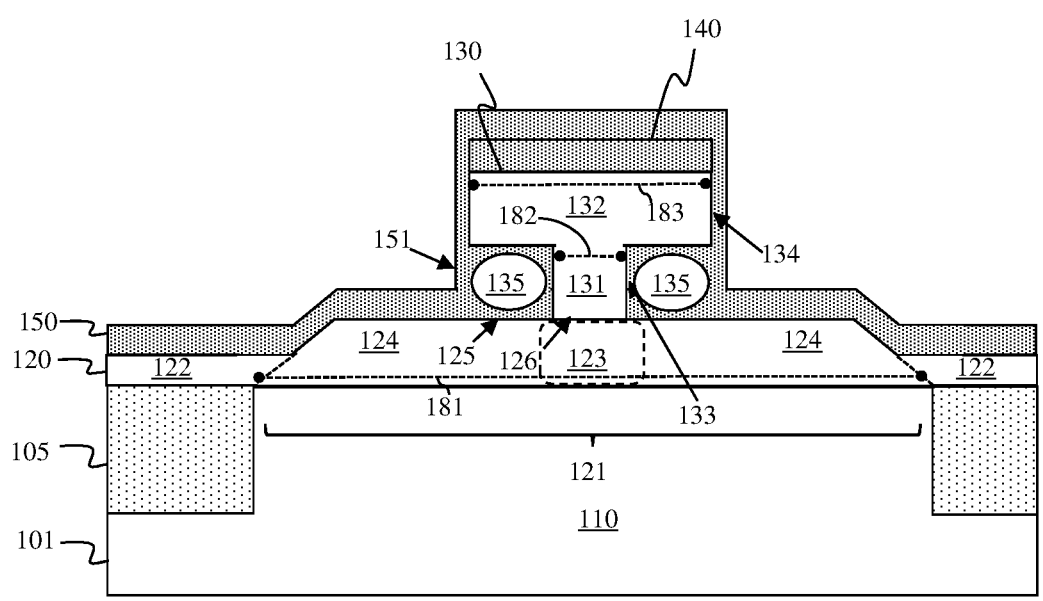
FIG. 14 is a cross-section diagram illustrating a partially completed transistor formed according to process flow A1 of FIG. 2.

Subsequently, a non-conformal dielectric layer 150 (e.g., a non-conformal silicon nitride layer) can be formed such that it is on the first semiconductor layer 120 and further extends upward and over the upper emitter region 132, thereby creating an airgap 135 (220, see FIG. 14). Such a non-conformal dielectric layer can be formed using a deposition process that is optimized to deposit little or no film under the upper, wider portion of the emitter (i.e., in the cavity 136 between the extrinsic base region 124 and the upper emitter region 132) and to close off the opening to the cavity 136, thus leaving an airgap 135, which is, in its entirety, above the level of the co-planar top surfaces 125-126 of the extrinsic and intrinsic base regions. Exemplary deposition processes that could be used include, but are not limited to, a plasma enhanced chemical vapor deposition (PECVD) process or a physical vapor deposition (PVD) process. PVD films are well known to deposit directionally in a non-conformal fashion. PECVD films can be optimized to minimize the conformal part of their deposition. For example, a PECVD nitride film deposited using $SiH_4$ and $N_2$ gas precursors is known to deposit non-conformally. It should, however, be noted that currently available deposition techniques including PECVD and PVD may result in the cavity 136 being at least partially filled with a portion 151 of the dielectric material of the dielectric layer 150 before the opening to the cavity 136 is closed off. In this case, the airgap 135 will, as illustrated, be contained within the portion 151 of the dielectric material. In this embodiment, a vertical portion of the dielectric layer 150 will be positioned laterally immediately adjacent to the sidewall 134 of the upper emitter region 132 and to the sidewall of the dielectric cap 140 and a horizontal portion of the dielectric layer 150 will be positioned above and immediately adjacent to the top surface of the dielectric cap 140. It should be noted that, due to the deposition process used to form the dielectric layer 150, the essentially vertical portions of that dielectric layer 150 may be the same thickness or thinner than the horizontal portions.

After the dielectric layer 150 is formed at process 220, additional processing can be performed in order to complete the embodiment 100A of the transistor shown in FIG. 1A (222). The additional processing can include, but is not limited to, deposition of one or more layers of interlayer dielectric material (ILD) 160 on the dielectric layer 150 above the transistor and formation of contacts that extend vertically through the ILD 160 and dielectric layer 150 to the extrinsic base region 124 (or, if applicable, to the silicide thereon) (see contacts 171), to the upper emitter region 132 (see contact 172), to the collector region 110 (not shown) and to the substrate 101 (not shown). The ILD material 160 can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Figure 15:
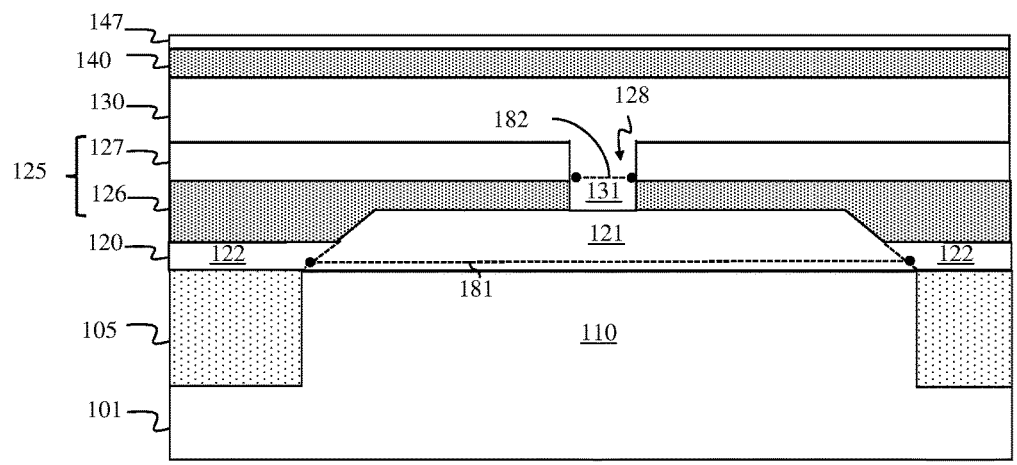
FIG. 15 is a cross-section diagram illustrating a partially completed transistor formed according to process flow A2 of FIG. 2.

Referring to the process flow A2, after the second semiconductor layer 130 is formed at process 208, a nitride-polysilicon (NP) stack can be formed above the second semiconductor layer 130 (224, see FIG. 15). That is, a stack of layers can be formed above the second semiconductor layer 130 and this stack can include a second silicon nitride layer 140 on the second semiconductor layer 130 and a polysilicon layer 147 on the second silicon nitride layer 140.

Figure 16:
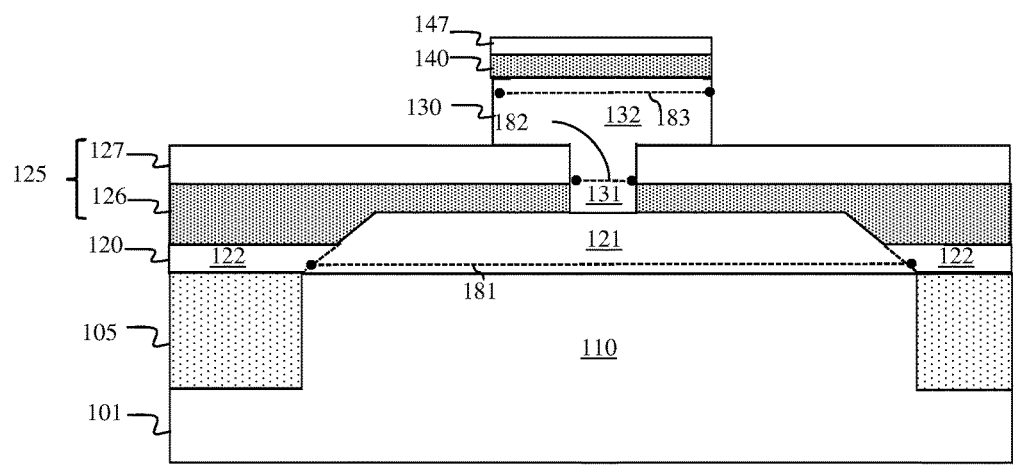
FIG. 16 is a cross-section diagram illustrating a partially completed transistor formed according to process flow A2 of FIG. 2.

Next, conventional lithographic patterning and etch processes can be performed in order to form, from the second semiconductor layer 130 and the NP stack, an essentially T-shaped emitter, in cross-section, with a multi-layer cap (226, see FIG. 16). The T-shaped emitter can have a lower emitter region 131, which is in the opening 128 so that it too has the same width as the opening (i.e., the second width 182), and an upper emitter region 132 above the lower emitter region 131. The second semiconductor layer 130 can specifically be patterned such that the upper emitter region 132 has a third width 183, which is greater than the second width 182 of the lower emitter region 131 and less than the first width 181 of the monocrystalline base 121. Thus, a portion of the upper emitter region 132 extends laterally beyond the sidewall 133 of the lower emitter region 131 onto the top surface of the sacrificial layers and an outer portion of the monocrystalline base 121 extends laterally beyond the sidewall 134 of the upper emitter region 132.

It should be noted that the second semiconductor layer 130 could be either in-situ doped at process 208 with a second type dopant (e.g., an N-type dopant, such as arsenic, phosphorus, or antimony or any other suitable N-type dopant as discussed in greater detail below) or subsequently implanted with the second type dopant. In either case, doping of the second semiconductor layer 130 should be performed such that the T-shaped emitter including the lower emitter region 131 and the upper emitter region 132 have the second type conductivity (e.g., N-type conductivity) at a relatively high conductivity level (e.g., such that the emitter is a N+ emitter).

Figure 17:
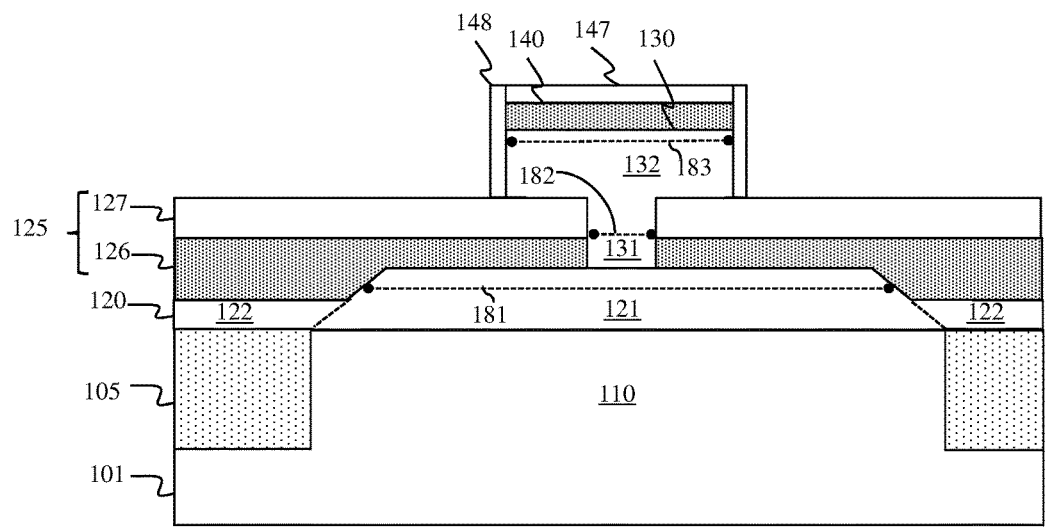
FIG. 17 is a cross-section diagram illustrating a partially completed transistor formed according to process flow A2 of FIG. 2.

Once the T-shaped emitter with a multi-layer cap is formed at process 226, a polysilicon sidewall spacer 148 can be formed on the sidewall 134 of the upper emitter region 132 (228, see FIG. 17). For example, an additional polysilicon layer can be conformally deposited over the sacrificial layers, the multi-layer cap and the upper emitter region 132. Then, an anisotropic etch process can be performed, removing the deposited polysilicon material from the top surface of the stack of sacrificial layers and leaving it on the sidewall 134 of the upper emitter region 132. It should be noted that in this embodiment the polysilicon layer 147 and polysilicon sidewall spacer 147 are all sacrificial features that protect the second silicon nitride layer 140 and the second semiconductor layer 130 during process 230, described below, and are generally not found in the resulting transistor structure.

Figure 18:
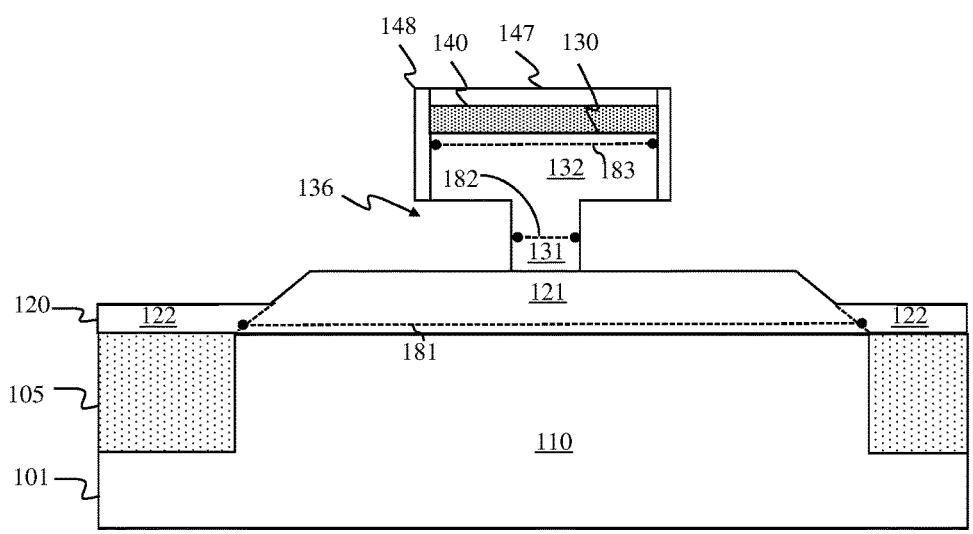
FIG. 18 is a cross-section diagram illustrating a partially completed transistor formed according to process flow A2 of FIG. 2.
Figure 19:
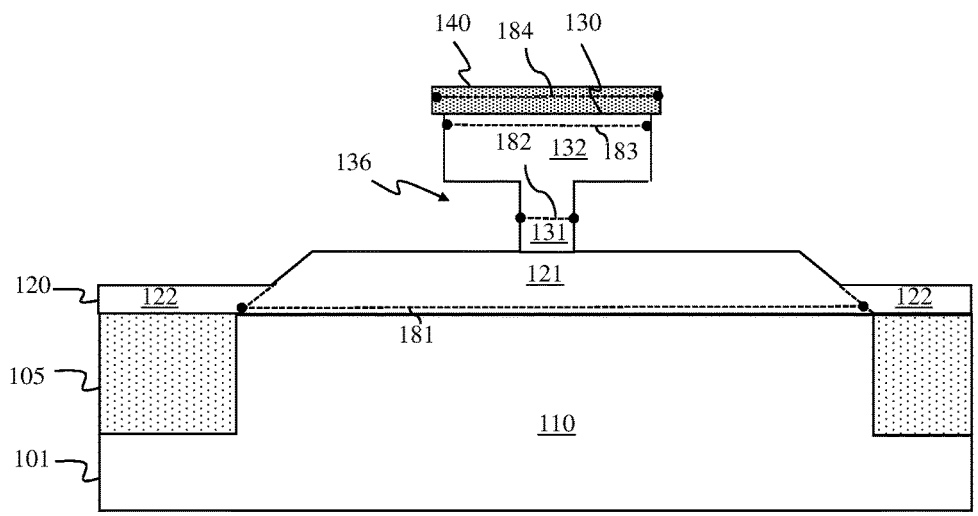
FIG. 19 is a cross-section diagram illustrating a partially completed transistor formed according to process flow A2 of FIG. 2.

The sacrificial layers 126 and 127, the polysilicon sidewall spacer 148 and polysilicon layer 147 of the multi-layer cap can subsequently be removed (230). For example, one or more selective etch processes can be performed in order to selectively remove the first silicon nitride layer 127 and the first silicon dioxide layer 126 over the semiconductor material of the first semiconductor layer 120, the second semiconductor layer 130 (i.e., the emitter) and the polysilicon cap 147 and polysilicon sidewall spacer 148 (see FIG. 18). An additional selective etch process can subsequently be performed to remove the polysilicon layer 147 of the multi-layer cap as well as the polysilicon sidewall spacer 148 (see FIG. 19). Various different techniques are well known in the art for selectively removing (i.e., etching away) silicon nitride and silicon dioxide over silicon and for selectively removing polysilicon over silicon and silicon nitride and, thus, the details of these techniques are omitted from this specification in order to allow the reader to focus on the salient aspects of the disclosed methods. It should be noted that, since the emitter 130 is also formed from polysilicon, etch back of the sidewalls of the emitter is anticipated. Thus, in this embodiment, the dielectric cap 140 (e.g., the silicon nitride cap) may have a fourth width 184 that is greater than the third width 183 of the upper emitter region 132 such that the sidewalls of the dielectric cap 140 and the upper emitter region are not vertically aligned. Alternatively, in another embodiment not shown, at least some of the polysilicon material of the polysilicon sidewall spacer and/or the multi-layer cap may remain on the emitter following process 230.

Figure 20:
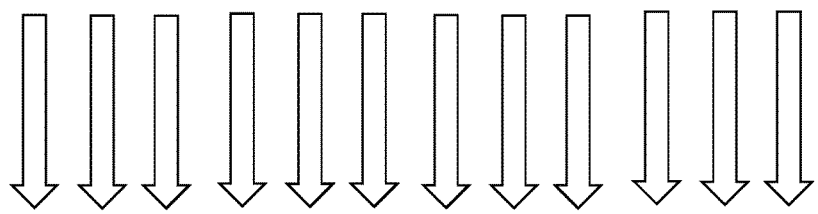
FIG. 20 is a cross-section diagram illustrating a partially completed transistor formed according to process flow A2 of FIG. 2.
Figure 20:
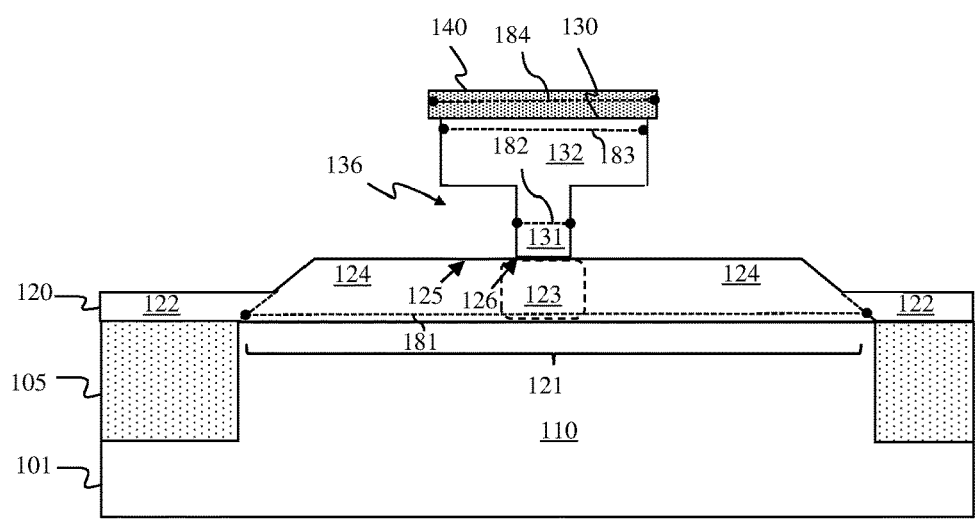

Removal of the sacrificial layers at process 230 exposes the outer portion of the monocrystalline base 121 and creates a cavity 136 positioned laterally adjacent to the lower emitter region 131 and between the monocrystalline base 121 and the portion of the upper emitter region 132 that extends laterally over the monocrystalline base 121. The exposed outer portion of the monocrystalline base 121 can be implanted with a first type dopant (e.g., a P-type dopant, such as boron or any other suitable P-type dopant as discussed in greater detail below), thereby creating, within the monocrystalline base 121, an extrinsic base region 124 with the first type conductivity at a relatively high conductivity level (e.g., thereby creating a P+ extrinsic base region) (232, see FIG. 20). The extrinsic base region 124 will be positioned laterally immediately adjacent and, particularly, laterally surrounding the intrinsic base region 123, which is aligned below the emitter and, thereby protected from doping during this process. As illustrated, since the intrinsic base region 123 and the extrinsic base region 124 are both contained within the same monocrystalline area 121 of the first semiconductor layer 120, the intrinsic base region 123 and the extrinsic base region 124 have essentially co-planar top surfaces 126 and 125, respectively. Optionally, following formation of the extrinsic base region 124 at process 232, a silicide layer (not shown) can be formed on the exposed semiconductor surfaces.

Figure 21:
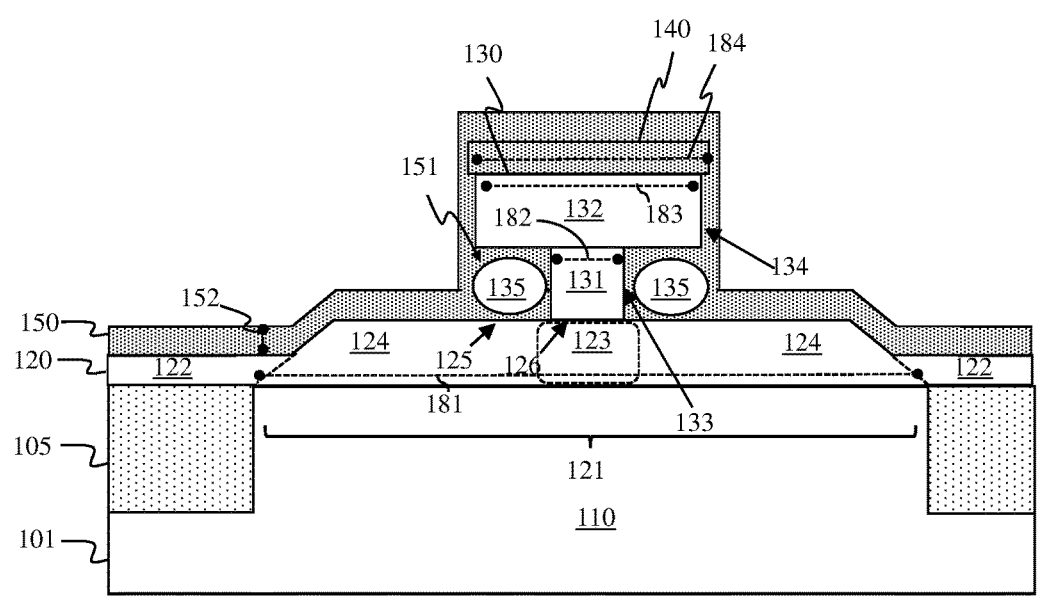
FIG. 21 is a cross-section diagram illustrating a partially completed transistor formed according to process flow A2 of FIG. 2.

Subsequently, a non-conformal dielectric layer 150 (e.g., a non-conformal silicon nitride layer) can be formed in the same manner as described above with regard to process 220 such that the dielectric layer 150 is on the first semiconductor layer 120 and further extends upward and over the upper emitter region 132, thereby creating an airgap 135 (234, see FIG. 21). Specifically, the dielectric layer 150 can be deposited using a deposition process, which is optimized to deposit little or no film within the area between the extrinsic base region 124 and the upper emitter region 132 (i.e., in the cavity 136 between the extrinsic base region 124 and the upper emitter region 132) and to close off the opening to the cavity 136, thus leaving an airgap 135, which, in its entirety, is above the level of the co-planar top surfaces 125-126 of the extrinsic and intrinsic base regions. As mentioned above, currently available deposition techniques including PECVD and PVD may result in the cavity 136 being at least partially filled with a portion 151 of the dielectric material of the dielectric layer 150 before the opening to the cavity 136 is closed off. In this case, the airgap 135 will, as illustrated, be contained within the portion 151 of the dielectric material. In this embodiment, a vertical portion of the dielectric layer 150 will be positioned laterally immediately adjacent to the sidewall 134 of the upper emitter region 132 and to the sidewall of the dielectric cap 140. Furthermore, a horizontal portion of the dielectric layer 150 will be above and immediately adjacent to the top surface of the dielectric cap 140. Again, it should be noted that, due to the deposition process used to form the dielectric layer 150, the essentially vertical portions of that dielectric layer 150 may be the same thickness or thinner than the horizontal portions.

After the dielectric layer 150 is formed at process 234, additional processing can be performed in order to complete the embodiment 100B of the transistor shown in FIG. 1B (222). The additional processing can include, but is not limited to, deposition of one or more layers of interlayer dielectric material (ILD) 160 on the dielectric layer 150 above the transistor and formation of contacts that extend vertically through the ILD 160 and the dielectric layer 150 to the extrinsic base region 124 (or, if applicable, to the silicide thereon) (see contacts 171), to the upper emitter region 132 (see contact 172), to the collector region 110 (not shown) and to the substrate 101 (not shown). The ILD material 160 can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Figure 22:
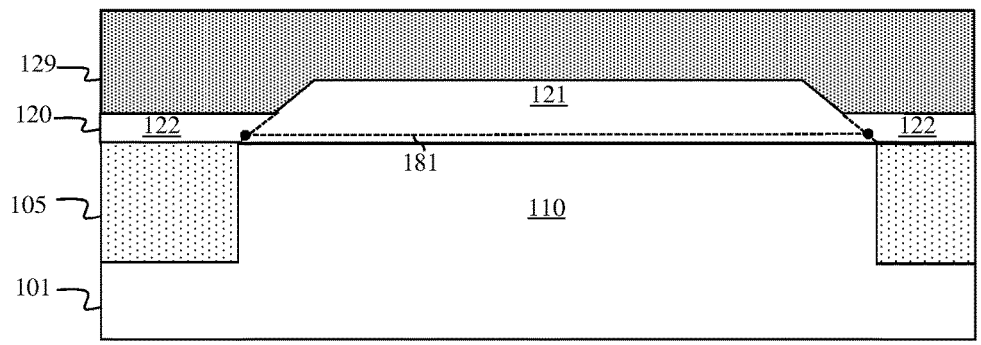
FIG. 22 is a cross-section diagram illustrating a partially completed transistor formed according to process flow B of FIG. 2.
Figure 23:
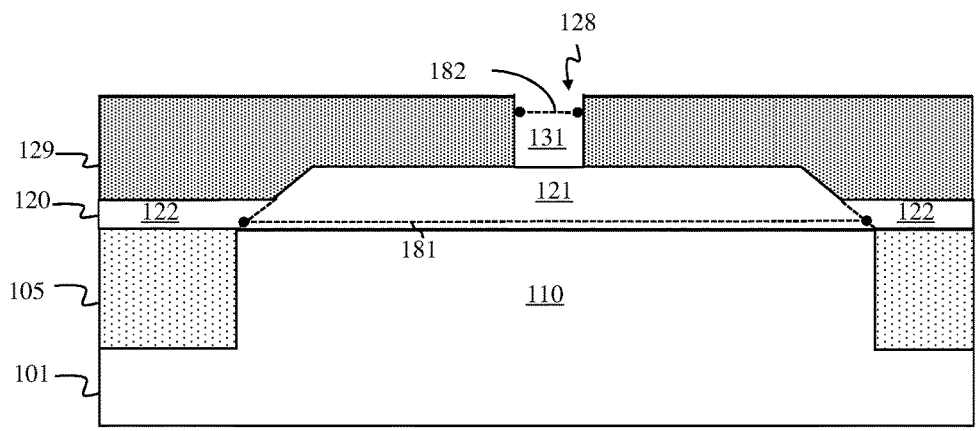
FIG. 23 is a cross-section diagram illustrating a partially completed transistor formed according to process flow B of FIG. 2.

Referring now to the process flow B in FIG. 2, after the first semiconductor layer 120 is epitaxially deposited at process 202, a single sacrificial layer 129 and, particularly, a silicon dioxide layer can be formed on the first semiconductor layer 120 (238, see FIG. 22). An opening 128 with a second width 182 can then be formed through the sacrificial layer 129 to a center portion only of the monocrystalline base 121 and, particularly, to a designated intrinsic base region within the monocrystalline base 121 (240, see FIG. 23). This opening 128 can be formed, for example, using conventional lithographic patterning and etch processes. Such processes are well known in the art and, thus, the details thereof are omitted from this specification in order to allow the reader to focus on the salient aspects of the disclosed method.

Figure 24:
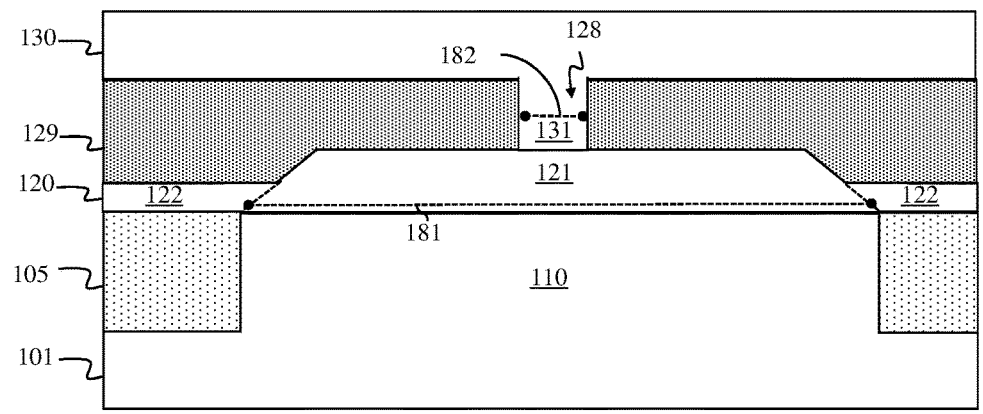
FIG. 24 is a cross-section diagram illustrating a partially completed transistor formed according to process flow B of FIG. 2.
Figure 25:
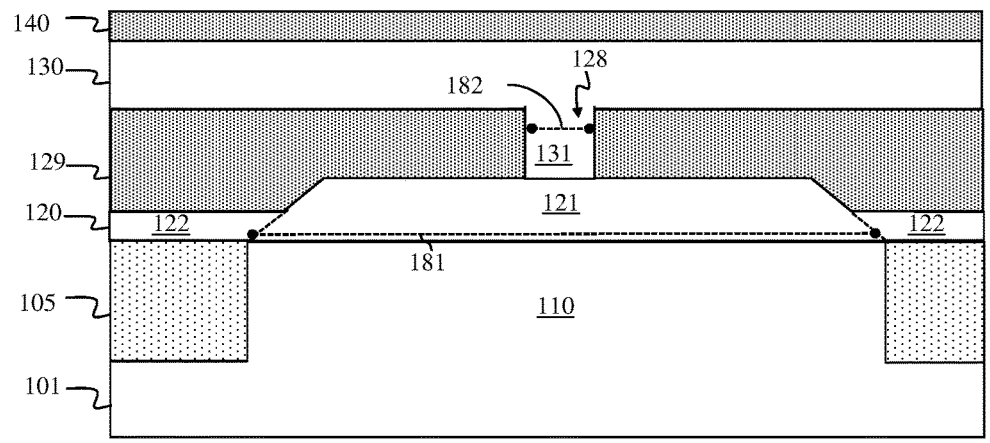
FIG. 25 is a cross-section diagram illustrating a partially completed transistor formed according to process flow B of FIG. 2.

Next, a pre-clean process can be performed and a second semiconductor layer 130 for an emitter can be formed (e.g., deposited by chemical vapor deposition (CVD)) onto the sacrificial layer 129 and in the opening 128 (242, see FIG. 24). This second semiconductor layer 130 can be, for example, a polysilicon layer. Then, a silicon nitride layer 140 can be formed above the second semiconductor layer 130 (242, see FIG. 25).

Figure 26:
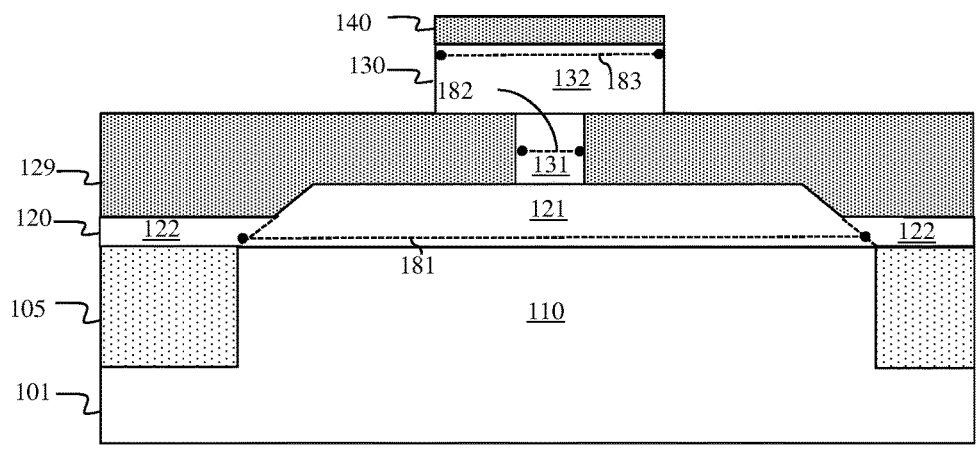
FIG. 26 is a cross-section diagram illustrating a partially completed transistor formed according to process flow B of FIG. 2.

Conventional lithographic patterning and etch processes can be performed in order to form, from the second semiconductor layer 130 and the silicon nitride layer, an essentially T-shaped emitter, in cross-section, with a silicon nitride cap 140 (246, see FIG. 26). The T-shaped emitter can have a lower emitter region 131, which is in the opening 128 so that it has the same width as the opening (i.e., the second width 182), and an upper emitter region 132 above the lower emitter region 131. The second semiconductor layer 130 can specifically be patterned such that the upper emitter region 132 has a third width 183, which is greater than the second width 182 of the lower emitter region 131 and less than the first width 181 of the monocrystalline base 121. Thus, a portion of the upper emitter region 132 extends laterally beyond the sidewall 133 of the lower emitter region 131 onto the top surface of the sacrificial layers and an outer portion of the monocrystalline base 121 extends laterally beyond the sidewall 134 of the upper emitter region 132.

It should be noted that the second semiconductor layer 130 could be either in-situ doped at process 242 with a second type dopant (e.g., an N-type dopant, such as arsenic, phosphorus, or antimony or any other suitable N-type dopant as discussed in greater detail below) or subsequently implanted with the second type dopant. In either case, doping of the second semiconductor layer 130 should be performed such that the T-shaped emitter including the lower emitter region 131 and the upper emitter region 132 have the second type conductivity (e.g., N-type conductivity) at a relatively high conductivity level (e.g., such that the emitter is a N+ emitter).

Figure 27:
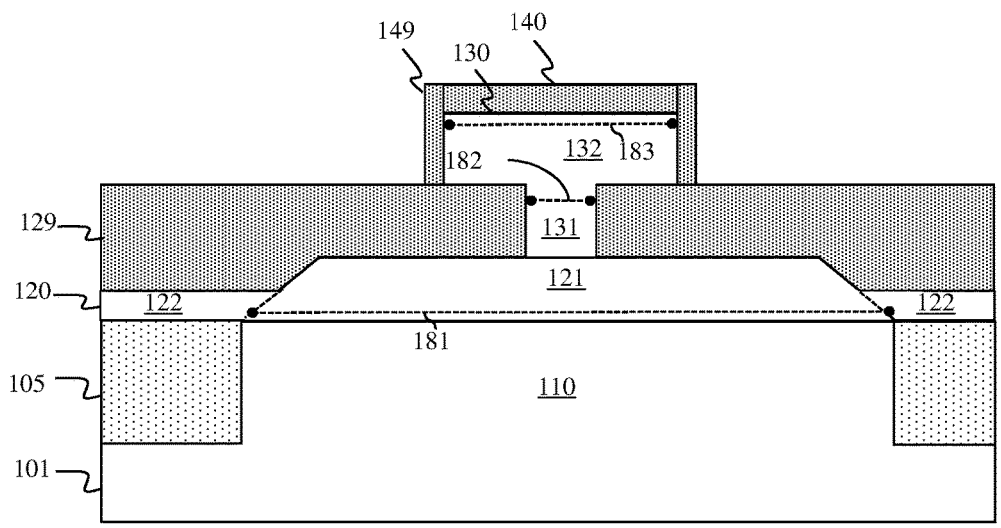
FIG. 27 is a cross-section diagram illustrating a partially completed transistor formed according to process flow B of FIG. 2.

Once the T-shaped emitter with a silicon nitride cap 140 is formed at process 246, a silicon nitride sidewall spacer 144 can be formed on the sidewall 134 of the upper emitter region 132 (248, see FIG. 27). For example, a silicon nitride layer can be conformally deposited over the sacrificial layer, the silicon nitride cap 140 and the upper emitter region 132. Then, an anisotropic etch process can be performed, removing the deposited silicon nitride material from the top surfaces of the silicon nitride cap and the sacrificial layer and leaving it on the sidewall 134 of the upper emitter region 132.

Figure 28:
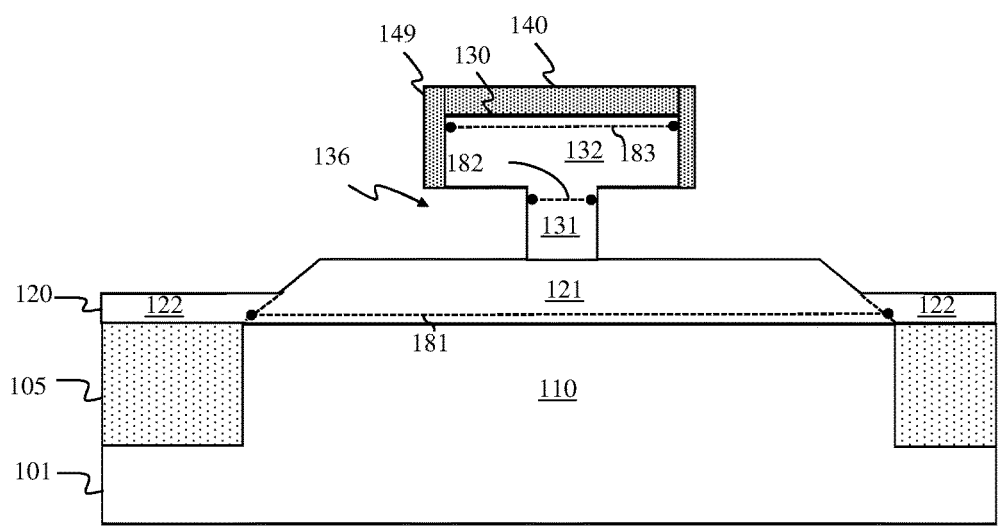
FIG. 28 is a cross-section diagram illustrating a partially completed transistor formed according to process flow B of FIG. 2.

The sacrificial layer can then be selectively removed (250, see FIG. 28). For example, a selective etch process can be performed in order to selectively remove the silicon dioxide layer over the semiconductor material of the first semiconductor layer 120 and second semiconductor layer 130 (i.e., the emitter). Various different techniques are well known in the art for selectively removing (i.e., etching away) silicon dioxide over silicon and, thus, the details of these techniques are omitted from this specification in order to allow the reader to focus on the salient aspects of the disclosed methods. Following process 250, the silicon nitride cap 140 and silicon nitride sidewall spacer 149 will remain intact on the top surface and sidewall of the upper emitter region 132, respectively.

Figure 29:
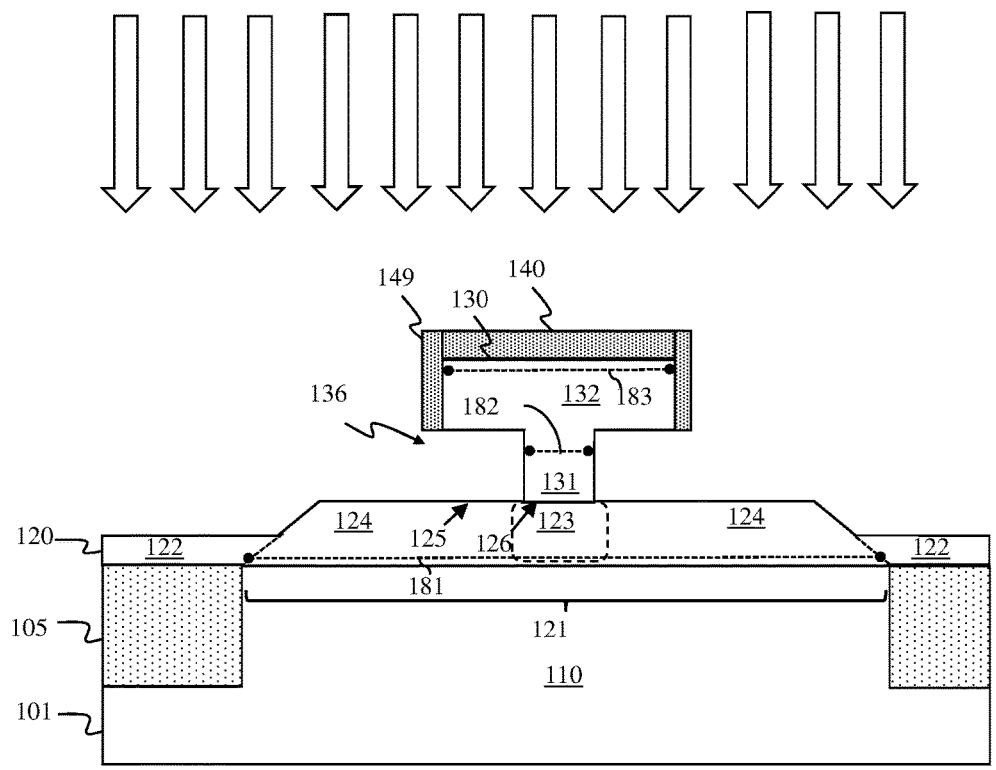
FIG. 29 is a cross-section diagram illustrating a partially completed transistor formed according to process flow B of FIG. 2.

Removal of the sacrificial layer at process 250 exposes the outer portion of the monocrystalline base 121 and creates a cavity 136 positioned laterally adjacent to the lower emitter region 131 and between the monocrystalline base 121 and the portion of the upper emitter region 132 that extends laterally over the monocrystalline base 121. This exposed outer portion of the monocrystalline base 121 can be implanted with a first type dopant (e.g., a P-type dopant, such as boron or any other suitable P-type dopant as discussed in greater detail below), thereby creating, within the monocrystalline base 121, an extrinsic base region 124 with the first type conductivity at a relatively high conductivity level (e.g., thereby creating a P+ extrinsic base region) (252, see FIG. 29). The extrinsic base region 124 will be positioned laterally immediately adjacent to and, particularly, laterally surrounding the intrinsic base region 123, which is aligned below the emitter and, thereby protected from doping during this process. As illustrated, since the intrinsic base region 123 and the extrinsic base region 124 are both contained within the same monocrystalline area of the first semiconductor layer 120, the intrinsic base region 123 and the extrinsic base region 124 have essentially co-planar top surfaces 126 and 125, respectively. Optionally, following formation of the extrinsic base region 124 at process 252, a silicide layer (not shown) can be formed on the exposed semiconductor surfaces.

Figure 30:
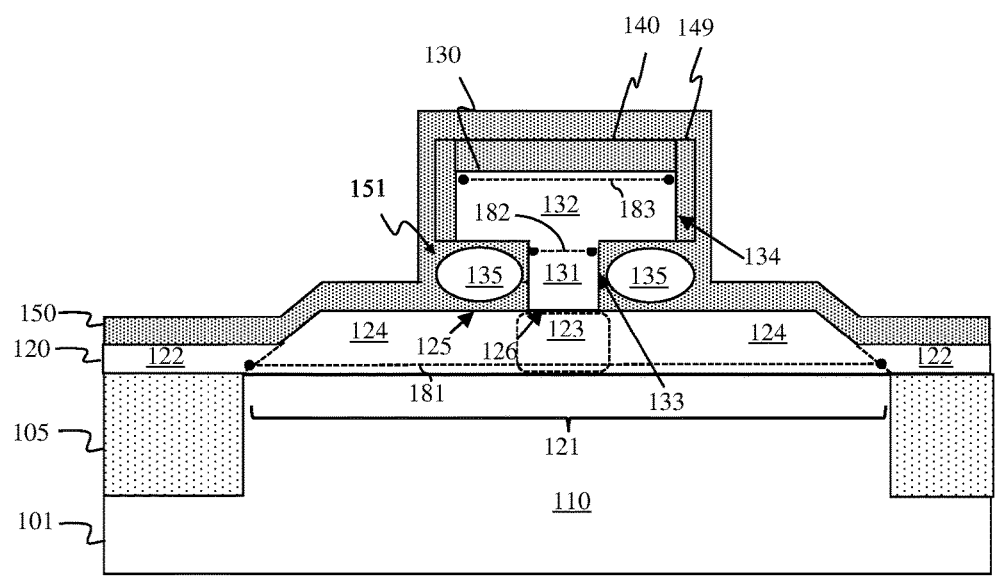
FIG. 30 is a cross-section diagram illustrating a partially completed transistor formed according to process flow B of FIG. 2.

Subsequently, a non-conformal dielectric layer 150 (e.g., a non-conformal silicon nitride layer) can be formed in the same manner as descried above with regard to process 220 such that the dielectric layer 150 is on the first semiconductor layer 120 and extends upward and over the upper emitter region 132, thereby creating an airgap 135 (254, see FIG. 30). Specifically, the dielectric layer 150 can be deposited using a deposition process, which is optimized to deposit little or no film within the area between the extrinsic base region 124 and the upper emitter region 132 (i.e., in the cavity 136 between the extrinsic base region 124 and the upper emitter region 132) and to close off the opening to the cavity 136, thus leaving an airgap 135, which is, in its entirety, above the co-planar top surfaces 125-125 of the extrinsic and intrinsic base regions. As mentioned above, currently available deposition techniques including PECVD and PVD may result in the cavity 136 being at least partially filled with a portion 151 of the dielectric material of the dielectric layer 150 before the opening to the cavity 136 is closed off. In this case, the airgap 135 will, as illustrated, be contained within the portion 151 of the dielectric material. In this embodiment, a vertical portion of the dielectric layer 150 will be positioned laterally immediately to the dielectric sidewall spacer 149. Furthermore, a horizontal portion of the dielectric layer 150 will be positioned above and immediately adjacent to the top surfaces of the dielectric sidewall spacer 149 and the dielectric cap 140. Thus, the dielectric layer 150 will be physically separated from the upper emitter region 132 by the dielectric cap 140 and dielectric sidewall spacer 149. Again, it should be noted that, due to the deposition process used to form the dielectric layer 150, the essentially vertical portions of that dielectric layer 150 may be the same thickness or thinner than the horizontal portions.

After the dielectric layer 150 is formed at process 254, additional processing can be performed in order to complete the embodiment 100C of the transistor shown in FIG. 1C (256). The additional processing can include, but is not limited to, deposition of one or more layers of interlayer dielectric material (ILD) 160 on the dielectric layer 150 above the transistor and formation of contacts that extend vertically through the ILD 160 and dielectric layer 150 to the extrinsic base region 124 (or, if applicable, to the silicide thereon) (see contacts 171), to the upper emitter region 132 (see contact 172) and to the substrate 101 (not shown). The ILD material 160 can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

For purposes of illustration, the disclosed transistors and methods of forming the transistors are described above using examples wherein the first type conductivity is P-type conductivity and the second type conductivity is N-type conductivity. However, it should be understood that, alternatively, the first type conductivity could be N-type conductivity and the second type conductivity could be P-type conductivity. In any case, those skilled in the art will recognize that different dopants can be used during different dopant implant or in situ doping processes to form, within a semiconductor device, different regions with different type conductivities. Those skilled in the art will also recognize that the dopants used during these different dopant implant or in situ doping processes will vary depending upon both the type of semiconductor material being used and the desired type conductivity (e.g., N-type conductivity or P-type conductivity). For example, a silicon-based semiconductor material can be doped during a dopant implant process with a Group III dopant, such as boron (B) or indium (In), in order to achieve P-type conductivity. Alternatively, a silicon-based semiconductor material can be doped during a dopant implant process with a Group V dopant, such as arsenic (As), phosphorous (P) or antimony (Sb), in order to achieve N-type conductivity. A gallium nitride (GaN) or gallium arsenide (GaAs)-based semiconductor material can be doped during a dopant implant process with beryllium (Be) or magnesium (Mg) in order to achieve P-type conductivity. Alternatively, the gallium nitride (GaN) or gallium arsenide (GaAs)-based semiconductor material can be doped during a dopant implant process with silicon (Si) in order to achieve N-type conductivity. Those skilled in the art will further recognize that the level of conductivity will vary depending upon the dopant concentration used and upon any counter doping performed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed devices and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a transistor (e.g., a bipolar junction transistor (BJT) or a heterojunction bipolar transistor (HBT)), which incorporates an airgap in order to achieve a relatively low base-emitter capacitance ($C_{be}$). Each embodiment of the transistor can have a monocrystalline base and, within the monocrystalline base, an intrinsic base region and an extrinsic base region positioned laterally adjacent to the intrinsic base region, wherein the intrinsic and extrinsic base regions have co-planar top surfaces. An essentially T-shaped emitter in cross-section can have a lower emitter region on the intrinsic base region and an upper emitter region above the lower emitter region. Each embodiment of the transistor can further have an airgap, which is positioned laterally adjacent to the lower emitter region so as to be between the extrinsic base region and a portion of the upper emitter region that extends over the extrinsic base region. Thus, the entire airgap is above the co-planar top surfaces of the intrinsic base region and the extrinsic base region. Also disclosed herein are methods of forming the above-described transistor embodiments.

What is claimed is:

1. A transistor comprising:
  a first semiconductor layer comprising a monocrystalline base, the monocrystalline base having a first width and comprising an intrinsic base region and an extrinsic base region positioned laterally adjacent to the intrinsic base region, the intrinsic base region and the extrinsic base region having essentially co-planar top surfaces;
  a second semiconductor layer comprising an emitter, the emitter comprising:
    a lower emitter region on the intrinsic base region and having a second width; and
    an upper emitter region on the lower emitter region and having a third width that is greater than the second width and less than the first width, wherein a top surface of the extrinsic base region, a sidewall of the lower emitter region and a bottom surface of a portion of the upper emitter region that extends over the extrinsic base region form a cavity; and
  a dielectric layer having portions on the extrinsic base region, positioned laterally adjacent and blocking an opening to the cavity opposite the sidewall of the lower emitter region, and extending over the upper emitter region,
  wherein an airgap is contained within the cavity so as to be positioned laterally adjacent to the sidewall of the lower emitter region and so as to be between the top surface of the extrinsic base region and the bottom surface of the portion of the upper emitter region that extends over the extrinsic base region such that the airgap is entirely above a level of the co-planar top surfaces of the intrinsic base region and the extrinsic base region.

2. The transistor of claim 1, wherein the dielectric layer is on the first semiconductor layer, extends over the upper emitter region, and comprises dielectric material that partially fills the cavity such that the airgap is fully encapsulated by the dielectric material.

3. The transistor of claim 1, the dielectric layer comprising a nitride layer.

4. The transistor of claim 1, further comprising a nitride cap on a top surface of the upper emitter region, the dielectric layer being immediately adjacent to a sidewall of the upper emitter region and above the nitride cap.

5. The transistor of claim 4, the nitride cap being wider than the upper emitter region.

6. The transistor of claim 1, further comprising a nitride cap and a nitride sidewall spacer on a top surface and sidewall, respectively, of the upper emitter region, the dielectric layer being separated from the upper emitter region by the nitride cap and the nitride sidewall spacer.

7. The transistor of claim 1, further comprising monocrystalline silicon substrate,
  the monocrystalline silicon substrate comprising an N-type collector region,
  the monocrystalline base comprising a monocrystalline silicon germanium base above and immediately adjacent to the N-type collector region,
  the extrinsic base region of the monocrystalline silicon germanium base comprising a P-type extrinsic base region, and
  the emitter comprising an N-type polysilicon emitter.

8. A transistor comprising:
  a first semiconductor layer comprising a monocrystalline base, the monocrystalline base having a first width and comprising an intrinsic base region and an extrinsic base region positioned laterally adjacent to the intrinsic base region, the intrinsic base region and the extrinsic base region having essentially co-planar top surfaces;
  a second semiconductor layer comprising an emitter, the emitter comprising:
    a lower emitter region on the intrinsic base region and having a second width; and
    an upper emitter region on the lower emitter region and having a third width that is greater than the second width and less than the first width, wherein a top surface of the extrinsic base region, a sidewall of the lower emitter region and a bottom surface of a portion of the upper emitter region that extends over the extrinsic base region form a cavity;
  a dielectric cap on a top surface of the upper emitter region, wherein the dielectric cap and the upper emitter region have equal widths and vertically aligned sidewalls; and
  a dielectric layer having portions on the extrinsic base region, positioned laterally adjacent and blocking an opening to the cavity opposite the sidewall of the lower emitter region, and further extending over the dielectric cap,
  wherein an airgap is contained within the cavity so as to be positioned laterally adjacent to the sidewall of the lower emitter region and so as to be between the top surface of the extrinsic base region and the bottom surface of the portion of the upper emitter region that extends over the extrinsic base region such that the airgap is entirely above a level of the co-planar top surfaces of the intrinsic base region and the extrinsic base region.

9. The transistor of claim 8, wherein the dielectric layer is on the first semiconductor layer, extends over the upper emitter region, and comprises dielectric material that partially fills the cavity such that the airgap is fully encapsulated by the dielectric material.

10. The transistor of claim 8, the dielectric layer comprising a nitride layer and the dielectric cap comprising a nitride cap.

11. The transistor of claim 8, wherein the dielectric layer is further positioned laterally immediately adjacent to the vertically aligned sidewalls of the dielectric cap and the upper emitter region and further extends above and is immediately adjacent to a top surface of the dielectric cap.

12. The transistor of claim 8, further comprising a dielectric sidewall spacer positioned laterally immediately adjacent to the vertically aligned sidewalls of the dielectric cap and the upper emitter region, wherein dielectric layer is positioned laterally immediately adjacent to the dielectric sidewall spacer and extends above and is immediately adjacent to a top surface of the dielectric cap.

13. The transistor of claim 8, further comprising monocrystalline silicon substrate,
  the monocrystalline silicon substrate comprising an N-type collector region,
  the monocrystalline base comprising a monocrystalline silicon germanium base above and immediately adjacent to the N-type collector region,
  the extrinsic base region of the monocrystalline silicon germanium base comprising a P-type extrinsic base region, and
  the emitter comprising an N-type polysilicon emitter.

14. A transistor comprising:
  a first semiconductor layer comprising a monocrystalline base, the monocrystalline base having a first width and comprising an intrinsic base region and an extrinsic base region positioned laterally adjacent to the intrinsic base region, the intrinsic base region and the extrinsic base region having essentially co-planar top surfaces;

a second semiconductor layer comprising an emitter, the emitter comprising:

a lower emitter region on the intrinsic base region and having a second width; and an upper emitter region on the lower emitter region and having a third width that is greater than the second width and less than the first width, wherein a top surface of the extrinsic base region, a sidewall of the lower emitter region and a bottom surface of a portion of the upper emitter region that extends over the extrinsic base region form a cavity;

a dielectric cap on a top surface of the upper emitter region, wherein the dielectric cap is wider than the upper emitter region;

a dielectric layer having portions on the extrinsic base region, positioned laterally adjacent and blocking an opening to the cavity opposite the sidewall of the lower emitter region, and further extending over the dielectric cap, wherein an airgap is contained within the cavity so as to be positioned laterally adjacent to the sidewall of the lower emitter region and so as to be between the top surface of the extrinsic base region and the bottom surface of the portion of the upper emitter region that extends over the extrinsic base region such that the airgap is entirely above a level of the co-planar top surfaces of the intrinsic base region and the extrinsic base region.

15. The transistor of claim 14, wherein the dielectric layer is on the first semiconductor layer, extends upward and is positioned laterally immediately adjacent to a sidewall of the upper emitter region, covers an edge portion of the dielectric cap that extends laterally beyond the sidewall of the upper emitter region and further covers a top surface of the dielectric cap.

16. The transistor of claim 14, wherein the dielectric layer further comprises dielectric material that partially fills the cavity such that the airgap is fully encapsulated by the dielectric material.

17. The transistor of claim 14, the dielectric layer comprising a nitride layer and the dielectric cap comprising a nitride cap.

18. The transistor of claim 14, further comprising monocrystalline silicon substrate, the monocrystalline silicon substrate comprising an N-type collector region, the monocrystalline base comprising a monocrystalline silicon germanium base above and immediately adjacent to the N-type collector region, the extrinsic base region of the monocrystalline silicon germanium base comprising a P-type extrinsic base region, and the emitter comprising an N-type polysilicon emitter.

* * * * *